US008395686B2

(12) United States Patent
Tatani et al.

(10) Patent No.: US 8,395,686 B2
(45) Date of Patent: Mar. 12, 2013

(54) SOLID-STATE IMAGING DEVICE, METHOD OF MANUFACTURING THE SAME, AND CAMERA

(75) Inventors: Keiji Tatani, Kanagawa (JP); John Rennie, Tokyo (JP); Susumu Inoue, Kanagawa (JP); Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 643 days.

(21) Appl. No.: 12/292,338

(22) Filed: Nov. 17, 2008

(65) Prior Publication Data
US 2009/0147101 A1 Jun. 11, 2009

(30) Foreign Application Priority Data

Dec. 6, 2007 (JP) ................................. 2007-316280
Apr. 23, 2008 (JP) ................................. 2008-113016

(51) Int. Cl.
*H04N 3/14* (2006.01)
*H04N 5/335* (2011.01)

(52) U.S. Cl. ........................................ 348/302; 348/294
(58) Field of Classification Search .................. 348/294, 348/302, 335, 342
See application file for complete search history.

(56) References Cited

U.S. PATENT DOCUMENTS

| 5,593,913 | A  | * | 1/1997 | Aoki ................................. 438/69 |
| 6,188,094 | B1 | * | 2/2001 | Kochi et al. ..................... 257/232 |
| 6,211,521 | B1 |   | 4/2001 | Bawolek et al. |
| 2002/0063214 | A1 | * | 5/2002 | Hsiao et al. ................. 250/338.4 |
| 2006/0186318 | A1 | * | 8/2006 | Mouli ........................ 250/208.1 |
| 2007/0164334 | A1 | * | 7/2007 | Kanbe ............................ 257/294 |
| 2007/0172970 | A1 | * | 7/2007 | Uya .................................. 438/22 |
| 2007/0243669 | A1 | * | 10/2007 | Suzuki et al. .................. 438/142 |
| 2008/0315339 | A1 | * | 12/2008 | Rennie ........................... 257/432 |
| 2009/0002531 | A1 | * | 1/2009 | Godaiin ......................... 348/294 |
| 2010/0133421 | A1 | * | 6/2010 | Im ............................... 250/227.2 |

FOREIGN PATENT DOCUMENTS

| JP | 06-205178 | 7/1994 |
| JP | 11-103037 | 4/1999 |
| JP | 2004-207433 A | 7/2004 |
| JP | 2005-079344 A | 3/2005 |
| JP | 2005-174967 | 6/2005 |
| JP | 2006-190958 | 7/2006 |
| JP | 2006-351801 | 12/2006 |
| WO | WO-2005/013369 A1 | 2/2005 |

OTHER PUBLICATIONS

Inaba et al., "Degradation-Free MOS Image Sensor with Photonic Crystal Color Filter", IEEE Electron Device Letters, vol. 27., No. 6, Jun. 2006.
Japanese Office Action issued Aug. 28, 2012 for corresponding Japanese Application No. 2008-113016.

* cited by examiner

*Primary Examiner* — Gevell Selby
(74) *Attorney, Agent, or Firm* — Rader, Fishman & Grauer PLLC

(57) ABSTRACT

A solid-state imaging device is provided. The solid-state imaging device includes a plurality of arrayed pixels, an optical inner filter layer, and an inner-layer lens. Each of the plurality of arrayed pixels includes a photoelectric conversion portion and a pixel transistor. The optical inner filter layer is configured to block infrared light and faces a light-receiving surface of the photoelectric conversion portion of a desired pixel among the arrayed pixels. The inner-layer lens is formed below the optical inner filter layer.

19 Claims, 18 Drawing Sheets

SOLID-STATE IMAGING DEVICE, METHOD OF MANUFACTURING THE SAME, AND CAMERA

CROSS REFERENCES TO RELATED APPLICATIONS

The present invention contains subject matter related to Japanese Patent Application JP 2007-316280 filed on Dec. 6, 2007 and Japanese Patent Application JP 2008-113016 filed on Apr. 23, 2008, in the Japanese Patent Office respectively, the entire contents of which being incorporated herein by reference.

BACKGROUND OF THE INVENTION

1. Field of the Invention

The present invention relates to a solid-state imaging device, for example a MOS image sensor, a method of manufacturing the same, and a camera using such a solid-state imaging device.

2. Description of the Related Art

Solid-state imaging devices can be roughly classified into charge transfer solid-state imaging devices typified by CCD image sensors and amplified solid-state imaging devices typified by CMOS image sensors. In comparison with the CMOS image sensor, the CCD image sensor may need a power supply voltage higher than that of the CMOS image sensor, because the CCD image sensor may require a high driving voltage for the transfer of a signal electric charge.

In recent years, therefore, the CMOS image sensors have been used more than the CCD image sensors as solid-state imaging devices mounted on a mobile apparatus, such as a camera-incorporated mobile phone unit or a personal digital assistant (PDA) because the CMOS image sensors have advantages over the CCD image sensors in terms of lower power supply voltage, power consumption, and the like.

The solid-state imaging device used in any mobile apparatus or the like has a reduced area per pixel along with miniaturization and high-resolution. In addition, the area of a photodiode provided as a photoelectric conversion portion is reduced along with a decrease in area of the pixel. Thus, it may result in a decrease in number of electrons (holes) photoelectrically converted. A reduction in area of the pixel is a disadvantageous for the collection of light and leads to a decrease in sensitivity or SNR, or the like. Thus, for example, a solid-state imaging device for brightly taking an image of a dark subject or the like has been known in the art. This solid-state imaging device includes a unit pixel matrix of a color pixel having an optical inner filter layer for blocking infrared light (IR cut filter) and a pixel on which infrared light is incident (Japanese Unexamined Patent Application Publication No. 2006-190958).

The incidence of infrared light on a typical color pixel results in insufficient color reproducibility. Therefore, a method for improving the sensitivity and SNR of pixel with the infrared light blocks the incidence of infrared light on color pixels using the above optical inner filter layer (IR cut filter) such as a plurality of dielectric layers that use refractive-index differences.

FIG. 1 illustrates a CMOS image sensor including a filter layer for blocking infrared light. FIG. 2 illustrates a CMOS image sensor without a filter layer for blocking infrared light. In each of FIGS. 1 and 2, a pixel is schematically represented only by a photodiode (PD) while a pixel transistor is omitted for making the configuration of the CMOS image sensor clearly understandable.

A CMOS image sensor 1 as illustrated in FIG. 2 includes an imaging area on the principal surface of a semiconductor substrate 2. The imaging area is formed of a plurality of pixels provided in a two-dimensional array. Each of the pixels has a photodiode (PD) 3 as a photoelectric conversion portion and a plurality of pixel transistors (MOS transistors, not shown). A plurality of wiring layers 6 with a plurality of layered lines 5 through an insulating interlayer 4 are formed on the principal surface of the pixel-formed semiconductor substrate 2. Furthermore, a color filter 7 and an on-chip microlens 8 are formed above the plurality of wiring layers 6 through a planarizing layer (not shown).

A CMOS image sensor 11 as illustrated in FIG. 1 includes an imaging area formed of a plurality of pixels provided in a two-dimensional array. Each of the pixels has a photodiode (PD) 3 as a photoelectric conversion portion and a plurality of pixel transistors (MOS transistors, not shown) on the principal surface of a semiconductor substrate 2. A plurality of wiring layers 6 with a plurality of layered lines 5 through an insulating interlayer 4 are formed on the principal surface of the pixel-formed semiconductor substrate 2. Furthermore, an optical inner filter layer (IR cut filter layer) 12 is formed above the plurality of wiring layers 6 for a pixel on which the incidence of infrared light may need to be blocked. In other words, the optical inner filter layer 12 is formed above each of the pixels of red (R), green (G), and blue (B) but no optical inner filter layer 12 is formed above one pixel (that is, IR pixel). A buried layer 13 is formed in an area where no optical inner filter layer 12 is formed and a color filter 7 and an on-chip microlens 8 are then formed with a planarizing layer 14 in between. Here, a unit pixel matrix includes four pixels, that is, the R, G, and B pixels and the IR pixel. The color filter for the IR pixel is formed of a filter transmitting visible light and infrared light. Furthermore, the optical inner filter layer 12 formed of a plurality of dielectric layers may need to be arranged below the on-chip microlens 8, the color filter 7, and the planarizing layer 14 made of an organic film or the like because of restricted film-forming temperature.

In the CMOS image sensor 11, the IR pixel positively uses infrared light. Thus, for example, the sensitivity, SNR, and the like of the CMOS image sensor 11 can be improved to allow a user to take a bright image with suitable color tone, for example, when the user wishes to take a bright image of a dark subject.

On the other hand, for increasing the efficiency of light focusing on the photodiode (PD) of each pixel, a solid-state imaging device having an inner-layer lens has been known in the art (see, Japanese Unexamined Patent Application Publication No. Heisei 11-103037).

Here, image sensors are devices used in a wide range of applications including cameras and video cameras.

The image sensors which can be used in such devices are formed of many pixels. The efficiency of the entire device can be determined by the dimensions and structure of each pixel.

Any device for multiple colors includes different pixels of three colors, red (R), green (G), and blue (B), by providing the pixels with the respective absorbing color filter materials in solid state originated from organic materials.

In general, a lens having the same size as that of the pixel is used for improving the collection of light within the pixel. In other words, the lens is provided to retain incident light so that the light comes into a focus on the light-receiving section of the pixel. Then, the light incident on the pixel is captured by the pixel as much as possible to prevent the light from scattering into the surrounding pixels.

Recently, several investigators have proposed providing open pixels for receiving the whole visible light along color pixels (see, for example, Japanese Unexamined Patent Application Publication No. Heisei 6-205178 and U.S. Pat. No. 6,211,521). Such open pixels may receive light the wavelength of which is over visible light or includes infrared light.

The use of open pixels joined to the respective color pixels makes possible the generation of a color image with an extremely low level of light intensity and may improve the response of the device.

An IR cut filter has been mounted on the outside of the device to improve color performance.

However, in the device using the open pixels designed as described above, the use of IR cut filter is limited to a color pixel with a need of blocking infrared light. Thus, there is a need of manufacturing an on-chip IR cut filter so that a pixel with a filter or without a filter can easily be provided.

The use of on-chip filter is not a newly proposed idea but difficult in actual designing.

On-chip filters typically used are mainly formed by alternately stacking materials having different refractive indexes, thereby adjusting the required spectrum of light generated (see, for example, Inaba et al., IEEE Electron Device Lett., 27, 6, 2006, pp. 457).

An etching technology is used to independently form such on-chip filters on a pixel that may require such a filter. Furthermore, in principle at the present, it is possible to form an on-chip filter that separates light at any optical bandwidth of visible and infrared light. Therefore, it means that a color image sensor having pixels for infrared or white light is of practical use.

A plurality of layers are usually stacked in such filters to have a planar structure so that uniformity and control over layer thickness can be improved (see, for example, Japanese Unexamined Patent Application Publications No. 2005-174967 and No. 2006-351801).

SUMMARY OF THE INVENTION

As shown in FIG. 1, the above-described CMOS image sensor 11 including the optical inner filter layer 12 in the layer under the color filter 7 has a larger distance H1 from the light-receiving surface of the photodiode (PD) 3 to the on-chip microlens 8, compared with the distance H2 of the CMOS image sensor 1 without the optical inner filter layer 12 as shown in FIG. 2. An increase in distance H1 leads to a decrease in probability of incident light to reach the photodiode (PD) 3. In addition, insufficient light may be collected by the on-chip microlens 8. Thus, color light incident on a target pixel by passing through the color filter, particularly oblique light L' tends to enter any adjacent pixel for another color. Therefore, there is a possibility of lowering the sensitivity and increasing color-mixing.

It is desirable to provide a solid-state imaging device including an optical inner filter layer blocking infrared light, having improved sensitivity and suppressing the occurrence of color-mixing. It is also desirable to provide a camera module including such a solid-state imaging device.

Such device of the above structure may have a high response to low-level light. However, there are two disadvantages for industrial production; the disadvantages are of color-mixing and ripples (little undulations or waves). Hereinafter, these disadvantages will be described.

First, the occurrence of color-mixing will be described.

In general, the formation of an on-chip filter between an on-chip lens and a photodiode leads to an increase in aspect ratio of a pixel due to an increase in optical height of the whole device. This will be described with reference to cross-sectional views, FIGS. 3A and 3B.

FIG. 3A is a cross-sectional view of a solid-state imaging device (image sensor) having no on-chip filter. FIG. 3A shows part of the device corresponding to two pixels in cross section. In the figure, the pixel on the left side is a color pixel (R, G, or B pixel) and the pixel on the right side is a white-light pixel (W pixel) for receiving and detecting the whole visible light. A color filter 1056 is formed in the color pixel (R, G, or B pixel) but not formed in the while-light pixel (W pixel).

On the other hand, FIG. 3B is a cross-sectional view of a solid-state imaging device (image sensor) having an on-chip filter 1059 formed of a plurality of layers in the color pixel (R, G, or B pixel). FIG. 3B also shows part of the device corresponding to two pixels in cross section. In the figure, the pixel on the left side is a color pixel (R, G, or B pixel).

In this case, an external IR-cut filter is omitted because of having the on-chip filter 1059. Thus, the pixel on the right side is a pixel capable of receiving and detecting infrared light in addition to the visible light. Hereinafter, the pixel will be referred to as "a pixel detecting visible light and infrared light" (A pixel).

As compared FIG. 3B with FIG. 3A, although the pixel shown in FIG. 3B has the same pixel size as the pixel shown in FIG. 3A, since the on-chip filter 1059 is provided, optical height of the whole device is increased with the height of the filter 1059 and aspect ratio of the pixel is also increased.

Therefore, an increase in aspect ratio of the pixel leads to a considerable increase in occurrence of color-mixing, or an increase in amount of light leaked into the adjacent pixel.

Furthermore, in the configuration of the device shown in FIG. 3B, the pixel detecting visible light and infrared light (A pixel) for receiving and detecting white light and infrared light obtains signal intensity higher than that of the adjacent color pixel. Thus, the pixel detecting visible light and infrared light (A pixel) can improve the sensitivity of the device, thereby obtaining a high response to low-level light.

However, if color-mixing occurs and a small amount of light is leaked into the adjacent color pixel from the A pixel, a change in signal intensity of the adjacent color pixel signal occurs considerably. Accordingly, it is difficult to reproduce correct colors.

The second disadvantage is of ripples (little undulations or waves).

When observing the wavelength spectrum of the device in detail, the ripples can be determined. With a device completely formed, the wavelength spectrum of light passing through each color pixel may have a smooth wide bandwidth distribution centering almost on a wavelength requested, for example, red for the red pixel.

However, if ripples are found when observing a wavelength spectrum of the device in detail, the observed spectrum, which is originally a smooth, wide bandwidth distribution, may include unnecessary undulations.

The undulation of such wavelength spectrum originates in at least two boundary surfaces having high reflexivity and located in the same horizontal structure.

In the configuration of the device shown in FIG. 3B, these two boundary surfaces correspond to the boundary surface between the bottom layer of the on-chip filter 1059 having a plurality of layers and an insulating layer 1052 and the boundary surface between the insulating layer 1052 and a silicon substrate 1051. Likewise, these two boundary surfaces correspond to the boundary surface between the top layer of the on-chip filter 1059 having a plurality of layers and the insulating layer 1052 and the boundary surface between the insulating layer 1052 and an inner-layer lens 1054.

Furthermore, light is momentarily captured between these two boundary surfaces and circulates inside a structure called a cavity.

Therefore, as represented by the arrows shown in FIG. 3B, the circulation of incident light occurs in cavities located above and below the on-chip filter 1059, respectively.

The circulation of light within a distance determined by the interval of the above two boundary surfaces causes a change in incident light sensitivity depending on whether the wavelength of incident light resonating with the determined distance, resulting in undulation of pixel's output corresponding to detecting incident light depending on the wavelength.

The period of the change closely relates to the thicknesses of the respective layers in the structure. Thus, a little change in thickness of these layers may shift the wavelength dependency of the undulation.

Therefore, if the thicknesses of some layers vary along a substrate silicon wafer during the manufacturing process, the spectrum of undulation will be determined by part of the original silicon wafer from which an image sensor chip is obtained. In this case, furthermore, the wavelength spectrum of the image sensor varies depending on the position of the chip in the original silicon wafer.

In other words, it is difficult to stably produce devices.

The occurrence of undulation distorts the wavelength spectra of red, green, and blue pixels. Thus, there is a disadvantage that it is difficult to generate a true color when reproducing the color.

Thus, when a related-art technology for the formation of an on-chip filter is used to provide a device including color pixels of red, green, and blue and a pixel detecting visible light and infrared light, color-mixing may further occur. As a result, the wavelength spectrum is distorted because of the deformation of the spectrum due to undulation thereof. This proves a difficulty in development of such a kind of sensor to a commercially available level.

It is desirable to provide a solid-state imaging device having an on-chip filter and capable of obtaining a high response to low-level light. It is also desirable to provide a method of manufacturing the solid-state imaging device and a camera including such a solid-state imaging device.

According to an embodiment of the present invention, there is provided a solid-state imaging device, including a plurality of arrayed pixels, an optical inner filter layer, and an inner-layer lens. Each of the arrayed pixels has a photoelectric conversion portion and a pixel transistor. The optical inner filter layer is configured to block infrared light, facing a light-receiving surface of the photoelectric conversion portion of a desired pixel among the arrayed pixels. Furthermore, the inner-layer lens is formed below the optical inner filter layer.

According to another embodiment of the present invention, there is provided a camera including a solid-state imaging device and an optical lens system. The solid-state imaging device includes a plurality of arrayed pixels, an optical inner filter layer, and an inner-layer lens. Each of the arrayed pixels has a photoelectric conversion portion and a pixel transistor. The optical inner filter layer is configured to block infrared light, facing a light-receiving surface of the photoelectric conversion portion of a desired pixel among the arrayed pixels. Furthermore, the inner-layer lens is formed below the optical inner filter layer.

According to any of the above embodiments of the present invention, the inner-layer lens is formed below the optical inner filter layer configured to block infrared light. Therefore, oblique light can be collected by the inner-layer lens and then incident on the target photoelectric conversion portion.

Furthermore, according to further embodiment of the present invention, there is provided a solid-state imaging device having pixels including a color pixel for detecting light of specific color in visible light and a pixel detecting visible light and infrared light.

The solid-state imaging device according to an embodiment of the present invention includes a substrate having a light-receiving section formed for each of the pixels.

The solid-state imaging device according to an embodiment of the present invention includes an on-chip filter whose surface is curved. The on-chip filter is formed above the substrate and formed of a plurality of stacked layers made of materials with different refractive indexes.

The solid-state imaging device according to the above-described further embodiment of the present invention includes an optical waveguide formed in the pixel detecting visible light and infrared light and adjacently to the on-chip filter of the color pixel. A material having a refractive index different from the plurality of materials of the on-chip filter is embedded in the optical waveguide.

The configuration of the solid-state imaging device according to the above embodiment of the present invention includes the on-chip filter in the color pixel. The on-chip filter is formed of a plurality of stacked layers made of materials with different refractive indexes. Therefore, the on-chip filter is configured to block light of a certain wavelength (e.g., infrared light). Thus, there is no need of providing the device with an external filter such as an external IR cut filter.

In addition, the formation of a pixel detecting visible light and infrared light allows the device to receive and detect incident light even at a low level on the pixel detecting visible light and infrared light. Furthermore, a combination of the pixel detecting visible light and infrared light and the color pixel allows the device to obtain a color image even if low-level light is incident on the respective pixels.

Furthermore, the solid-state imaging device according to the further embodiment of the invention includes the on-chip filter whose surface is curved. The curved on-chip filter can act as a lens. Therefore, incident light can be also collected by the on-chip filter. This leads to suppress a leakage of light to the adjacent pixel, or suppress color-mixing. Furthermore, the shading property of the device can be also improved.

Furthermore, as the surface of the on-chip filter is curved, light can be reflected by the boundary surfaces and finally dispersed even if light is incident between two boundary surfaces. Therefore, the wavelength spectrum of light received and detected by the color pixel is considerably suppressed from causing further undulation. Thus, the undulation can be reduced to a negligible level.

Furthermore, according to the solid-state imaging device of the above further embodiment of the invention, an optical waveguide is formed in the pixel detecting visible light and infrared light and adjacently to the on-chip filter of the color pixel. A material having a refractive index different from the plurality of materials of the on-chip filter is embedded in the optical waveguide.

Therefore, the optical waveguide can introduce the light incident on the pixel detecting visible light and infrared light into the light-receiving section of the substrate. Oblique light incident on the pixel detecting visible light and infrared light is reflected on the lateral wall surface of the optical waveguide and then allowed to incident on the light-receiving section of the substrate. Thus, a leakage of light from the pixel detecting visible light and infrared light to the adjacent pixel can be reduced greatly.

According to further another embodiment of the present invention, there is provided a method of manufacturing a solid-state imaging device. Here, the solid-state imaging device includes pixels: a color pixel for detecting specific color in visible light and a pixel detecting visible light and infrared light.

The method includes the steps of: forming a light-receiving section of each of the pixels in a substrate; and forming an on-chip filter including a plurality of stacked layers made of materials having different refractive indexes on a layer having a curved upper surface formed on the substrate.

The method further includes the steps of: forming a hole by selectively removing the on-chip filter of the pixel detecting visible light and infrared light; and forming an optical waveguide in the pixel detecting visible light and infrared light by filling the hole with a material having a refractive index different from the refractive indexes of the materials of the on-chip filter.

The method further includes the step of forming a color filter in the color pixel.

According to the method of manufacturing a solid-state imaging device of the above embodiment of the invention, the on-chip filter is formed by stacking a plurality of layers made of their respective materials having different refractive indexes and part of the on-chip filter in the pixel detecting visible light and infrared light is then selectively removed. Thus, the color pixel retains the remaining on-chip filter. The on-chip filter can block light of a certain wavelength (e.g., infrared light). Thus, there is no need of forming an external filter, such as an external IR cut filter.

Furthermore, according to the method of manufacturing a solid-state imaging device of the above embodiment of the invention, the on-chip filter including a plurality of stacked layers made of their respective materials having different refractive indexes is formed on the curved upper surface of a layer formed on the substrate. Thus, the on-chip filter whose surface is curved is thus formed. Therefore, the on-chip filter can act as a lens, so that the incident light can be also collected by the on-chip filter.

Furthermore, according to the method of manufacturing a solid-state imaging device of the above embodiment of the invention, the optical waveguide is formed by selectively removing the on-chip filter in the pixel detecting visible light and infrared light to form a hole and then filling the hole with a material having a refractive index different from the refractive indexes of a plurality of materials of the on-chip filter. Therefore, as described above, it becomes possible to greatly reduce a leakage of light from the pixel detecting visible light and infrared light to the adjacent pixel.

According to further another embodiment of the present, there is provided a camera having the solid-state imaging device of any of the above embodiments of the present invention.

A camera according to still another embodiment of the invention includes the solid-state imaging device of the above further embodiment of the invention. Thus, it is allowed to receive and detect incident light even at a low level in the pixel detecting visible light and infrared light. In addition, a color image can be obtained even if the low-level light is incident. Furthermore, the occurrence of color-mixing can be suppressed in the device. Besides, the shading property of the device can be also improved.

As described above, according to an embodiment of the invention, the oblique incident light is collected by the inner-layer lens located below the optical inner filter layer. The light is prevented from being incident on the adjacent pixel. Therefore, the device has an improved sensitivity and the occurrence of color-mixing can be suppressed.

According to an embodiment of the present invention, the camera includes the above solid-state imaging device. Thus, the camera has an improved sensitivity and can suppress the occurrence of color-mixing, thereby attaining high image quality.

According to an embodiment of the invention, even if low-level light is incident, the light can be received and detected on the pixel detecting visible light and infrared light. In addition, a combination of the pixel detecting visible light and infrared light and the color pixel allows the device to obtain a color image even if low-level light is incident.

Therefore, a high response to the low-level light can be obtained.

Furthermore, according to an embodiment of the invention, the occurrence of color-mixing can be suppressed in the device.

Furthermore, the occurrence of an excessive undulation of the wavelength spectrum in the color pixel can be suppressed. Then, a true color can be reproduced correctly. Thus, an image with high quality can be obtained.

Therefore, according to any of the above embodiments of the present invention, the solid-state imaging device and camera obtaining a high response to low-level light can be provided.

BRIEF DESCRIPTION OF THE DRAWINGS

FIG. 3A illustrates one without an on-chip filter and FIG. 3B illustrates one with an on-chip filter.

FIG. 10A to FIG. 10C represent the respective steps of the method.

DESCRIPTION OF THE PREFERRED EMBODIMENTS

Hereinafter, embodiments of the present invention will be described in detail with reference to the attached drawings.

Figure 4:
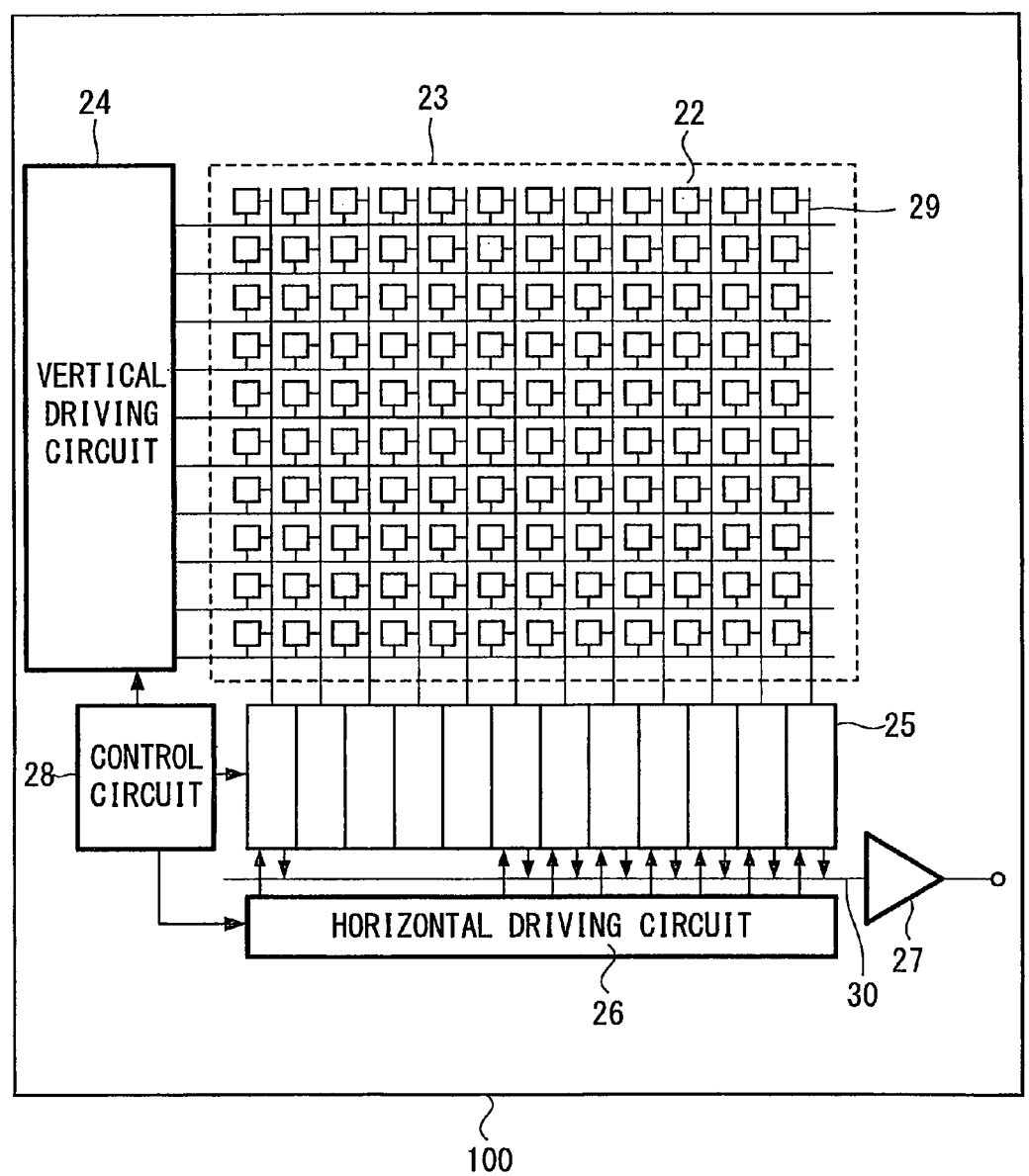
FIG. 4 is a schematic diagram illustrating the whole configuration of a solid-state imaging device according to an embodiment of the present invention.

FIG. 4 is a schematic view of the whole configuration of a CMOS solid-state imaging device (image sensor) as a solid-state imaging device according to an embodiment of the present invention. A solid-state imaging device 21 of the present embodiment includes an imaging area 23 and peripheral circuits thereof on a semiconductor substrate 100 such as a silicon substrate. On the imaging area 23, a plurality of pixels 22 with their respective photoelectric conversion portions is regularly-arranged in a two dimensional array. In addition, the peripheral circuits include a vertical driving circuit 24, a column-signal processing circuit 25, a horizontal driving circuit 26, an output circuit 27, a control circuit 28, and the like.

The control circuit 28 generates signals (e.g., a clock signal and a control signal) used as standards for the operation of the vertical driving circuit 24, the column-signal processing circuit 25, the horizontal driving circuit 26, and the like, on the basis of a vertical synchronizing signal, a horizontal synchronizing signal, and a master clock. The generated signals are input to the vertical driving circuit 24, the column-signal processing circuit 25, the horizontal driving circuit 26, and the like.

The vertical driving circuit 24 includes, for example, a shift register and selectively scans pixels 22 per row on the imaging area 23 in the vertical direction in succession. A pixel signal based on a signal electric charge generated in response to the amount of light received on a photoelectric conversion portion (photodiode) of each pixel 22 is supplied to a column-signal processing circuit 25 through a vertical signal line 29.

The column-signal processing circuit 25 is arranged for, for example, each column of the pixels 22. Signals output from the pixels 22 in one row are subjected to signal processing for each column, such as in a correlative double sampling circuit (CDS) for removing a noise (i.e., a fixed pattern noise inherent in the pixel 22) and signal amplification using a black reference pixel (not shown in figure, formed around an effective pixel region). A horizontal selection switch (not shown) is connected between an output stage of the column-signal processing circuit 25 and a horizontal signal line 30.

The horizontal driving circuit 26 includes, for example, a sift register. It selects each of the column-signal processing circuits 25 in order by sequentially outputting horizontal scanning pulses. Pixel signals from the respective column-signal processing circuits 25 are output to the horizontal signal line 30, respectively.

The output circuit 27 carries out signal processing on signals sequentially supplied from the respective column-signal processing circuits 25 through the horizontal signal line 30 and outputs the signals.

Figure 5:
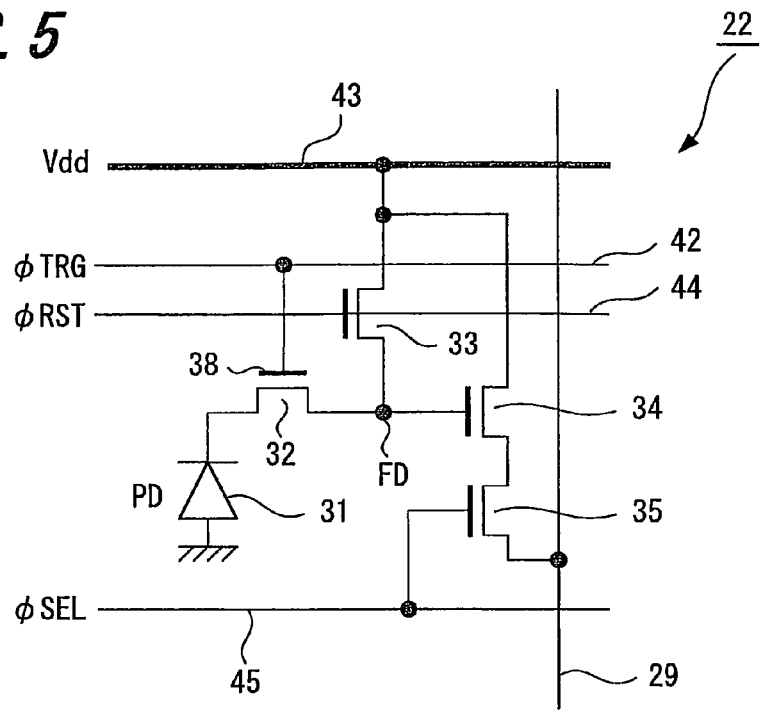
FIG. 5 is an equivalent circuit diagram illustrating an example of a unit pixel.

FIG. 5 illustrates an example of an equivalent circuit of the above pixel 22. The pixel 22 includes: a photoelectric conversion portion such as a photodiode (PD) 31; and a plurality of pixel transistors, that is, MOS transistors. The plurality of MOS transistors includes, for example, a transfer transistor 32, a reset transistor 33, an amplification transistor 34, and a selection transistor 35.

The photodiode (PD) 31 carries out the photoelectric conversion of converting light into photoelectric charges (here, electrons), the amount of which depends on the amount of light received. The cathode of the photodiode (PD) 31 is connected to the gate of the amplification transistor 34 through the transfer transistor 32. A node electrically connecting to the gate of the amplification transistor 34 is referred to as a floating diffusion part (FD). The floating diffusion part (FD) is formed at the drain of the transfer transistor 32.

The transfer transistor 32 is connected between the cathode of the photodiode (PD) 31 and the floating diffusion part (FD). A gate 38 of the transfer transistor 32 is turned ON when a transfer pulse φTRG is applied to the transfer transistor 32 through a transfer line 42. As a result, the electric charge of the photodiode (PD) 31 is transferred to the floating diffusion part (FD).

The drain of the reset transistor 33 is connected to a pixel power (Vdd) line 43 and the source thereof is connected to the floating diffusion part (FD). The reset transistor 33 is turned ON when a reset pulse φRST is applied to the gate thereof through a reset line 44. In this ON state, the floating diffusion part (FD) is reset by draining the electric charges of the floating diffusion part (FD) to the pixel power line 43 before the transfer of a signal charge from the photodiode (PD) 31 to the floating diffusion part (FD).

A gate of the amplification transistor 34 is connected to the floating diffusion part (FD) and the drain thereof is connected to the pixel power line 43. The amplification transistor 34 outputs the potential of the floating diffusion part (FD) after reset by the reset transistor 33 as a reset level. Furthermore, the amplification transistor 34 outputs the potential of the floating diffusion part (FD) after transfer of a signal charge by the transfer transistor 32 as a signal level.

Furthermore, for example, the drain of the selection transistor 35 is connected to the source of the amplification transistor 34 and the source thereof is connected to the vertical signal line 29. The selection transistor 35 is turned ON when a selection pulse φSEL is applied to the gate thereof through a selection line 45. A signal output from the amplification transistor 34 is relayed to the vertical signal line 29 while the pixel 22 is being selected.

Wiring lines in the lateral direction including the reset line 44 and the selection line 45 are shared by the pixels on the same row and controlled by the vertical driving circuit 24.

Note that the selection transistor 35 may be connected between the pixel power line 43 and the drain of the amplification transistor 34 in another example of the circuit configuration. In the above-described example, the pixel includes four transistors. Alternatively, the pixel may have three transistors by omitting the selection transistor.

Figure 6:
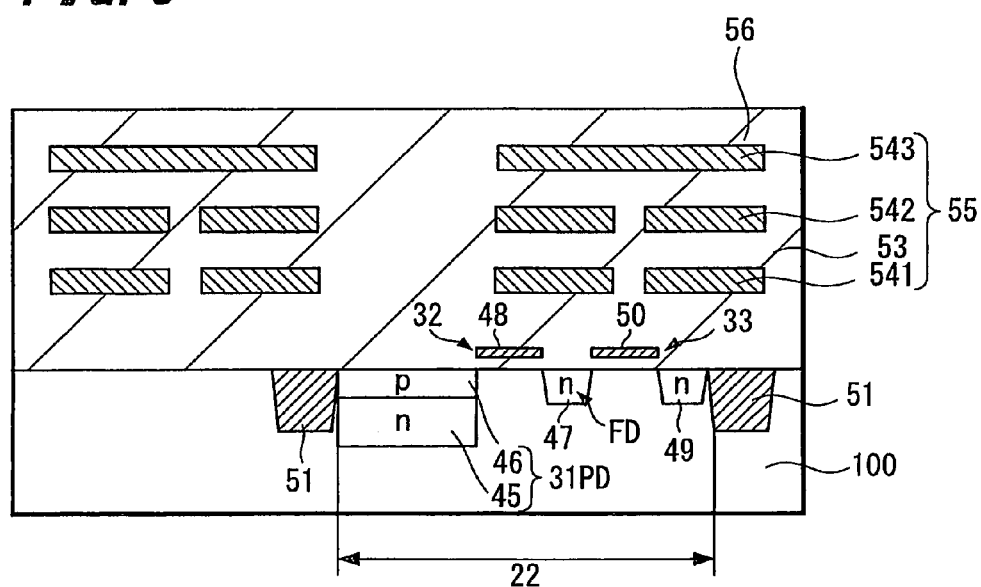
FIG. 6 is a schematic view illustrating the cross-sectional structure of the unit pixel.

FIG. 6 illustrates an example of a cross-sectional structure of main parts of the pixel. A unit pixel 22 includes a photodiode (PD) 31 having a first conductivity-type (e.g., n-type) charge accumulating area 45 and a second conductivity-type (e.g., p-type) semiconductor area (that is, p-type accumulation layer) 46 on the surface of the area 45 and a plurality of pixel transistors (MOS transistors). The photodiode (PD) 31 and the plurality of pixel transistors are formed on a principal surface of a semiconductor substrate 100. The photodiode (PD) 31 functions as a photoelectric conversion portion. FIG. 6 illustrates the transfer transistor 32 and the reset transistor 33 among a plurality of pixel transistors. The transfer transistor 32 includes an n-type semiconductor area 47 provided as a floating diffusion part (FD), the photodiode (PD) 31, and a transfer gate electrode 48 formed through a gate-insulating film. The reset transistor 33 includes the n-type semiconductor area 47 provided as a floating diffusion part (FD), an n-type semiconductor area 49, and a reset gate electrode 50 formed through a gate-insulating film. The unit pixel 22 can be separated from an adjacent pixel by an element-separating area 51.

On the semiconductor substrate 100 on which the pixels 22 are formed, a plurality of wiring layers 55 are formed through an insulating interlayer 53. In this example, the layers 55 may include three lines 54 [541, 542, and 543] made of three respective metal films. A planarizing layer 56 is formed above the plurality of layers 55. The lines 54 can be formed at the area except of areas corresponding to the photodiodes (PD) 31. Furthermore, but not shown in the figure, later-described optical elements including a color filter, an on-chip microlens, and the like can be formed.

Furthermore, according to an embodiment of the present invention, an inner-layer lens for focusing incident light is formed above the plurality of wiring layers 55, which corresponds to each of all pixels at least in an effective pixel area. Further, an optical inner filter layer for blocking infrared light can be formed above the inner-layer lens. In other words, in the present embodiment, an inner-layer lens is formed below an optical inner filter layer to collect oblique light to improve the efficiency of focusing light onto a pixel to improve the sensitivity of the device, while simultaneously preventing the oblique light from being incident on the adjacent pixel to suppress color-mixing.

Figure 7:
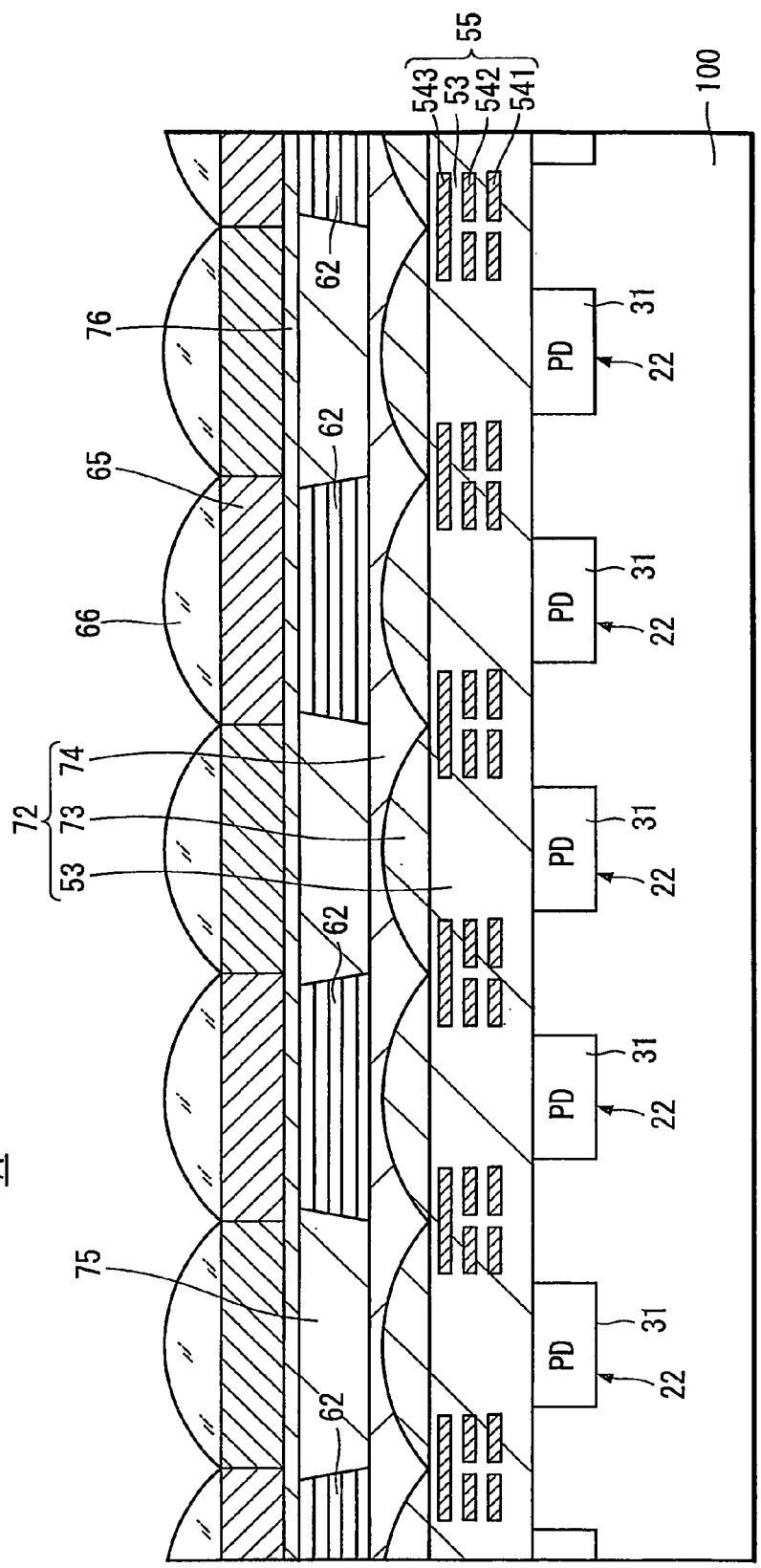
FIG. 7 is a schematic cross sectional view illustrating a solid-state imaging device according to a first embodiment of the present invention.

Next, FIG. 7 illustrates a cross-sectional structure of main parts of a CMOS solid-state imaging device according to a first embodiment of the present invention. In order to describe an embodiment of the present invention to be understandable, a pixel is represented only by a photodiode (PD) 31 and schematically described while omitting pixel transistors. The same will be applied to each of other embodiments described later.

As shown in FIG. 7, a CMOS solid-state imaging device 71 according to the first embodiment includes a plurality of pixels 22, each having the photodiode (PD) 31, arranged in a two-dimensional array on the principal surface of a semiconductor substrate 100. In addition, a plurality of wiring layers 55 are formed on the semiconductor substrate 100 through an insulating interlayer 53. In this example, three layered lines 54 [541, 542, and 543] form the plurality of wiring layers 55. An inner-layer lens 72 is formed corresponding to the respective pixels 22 above the plurality of wiring layers 55. An optical inner filter layer 62 for blocking infrared light is formed above the inner-layer lens 72, corresponding to a desired pixel.

Furthermore, a buried layer 75 fills a space between the optical inner filter layers 62 adjacent to each other. A planarized insulating film, or a planarizing layer 76, is formed above the buried layer 75. In the present embodiment, the buried layer 75 may be an insulating film, such as a silicon dioxide film or a silicon nitride film and the planarizing layer 76 may be an organic film. A color filter 65 and an on-tip microlens 66 are formed in this order above the planarizing layer 76.

Figure 8A:
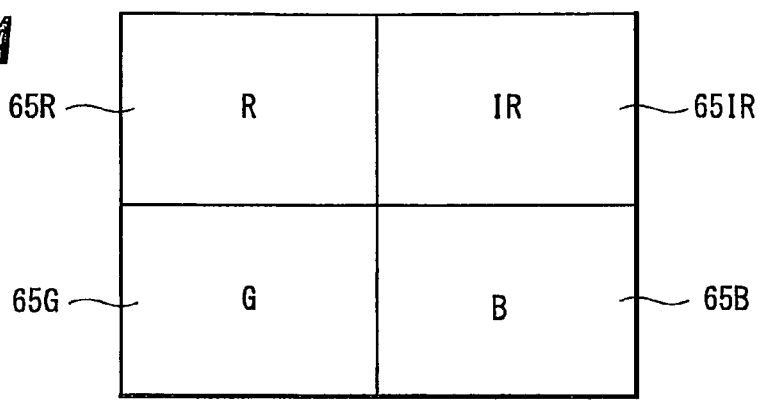
FIGS. 8A and 8B are plan views illustrating an example of the array of color filters applied to an embodiment of the present invention.

As shown in FIG. 8A, in this example, the color filter 65 is laid out to have a red (R) filter component 65R, a green (G) filter component 65G, a blue (B) filter component 65B, and a filter component which transmits all the wavelengths of light including infrared light (hereinafter, referred to as infrared light (IR) filter component for convenience) 65IR as one unit which is repetitively arranged. The pixel corresponding to the red filter component 65R is a red (R) pixel. The pixel corresponding to the green filter component 65G is a green (G) pixel. The pixel corresponding to the blue filter component 65B is a blue (B) pixel. The pixel corresponding to the infrared-light filter component 65IR is an infrared light (IR) pixel.

Figure 9:
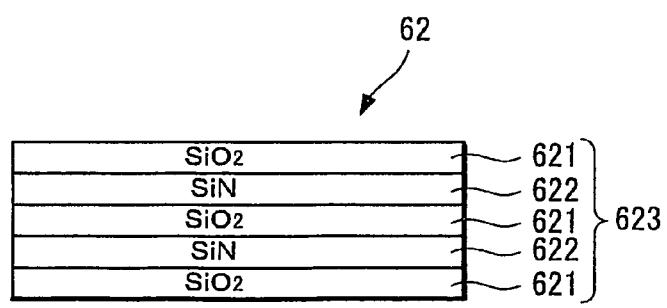
FIG. 9 is a schematic cross-sectional view illustrating an example of an optical inner filter layer formed of a plurality of dielectric films for blocking infrared light, which is applied to an embodiment of the present invention.

The above optical inner filter layer 62 is formed corresponding to any of pixels of three colors, R, G, and B but not to an IR pixel. As shown in FIG. 9, the optical inner filter layer 62 may be formed of a dielectric film 623 including dielectric materials with different refractive indexes. For example, it may include silicon dioxide ($SiO_2$) films 621 and silicon nitride (SiN) films 622, which are formed in desired film thicknesses and stacked alternately.

The $SiO_2$/SiN stacked film may be, for example, one with ten layers in total, i.e., five $SiO_2$ films each having a film thickness of 131 nm and five SiN films each having a film thickness of 95 nm.

In the present embodiment, the above inner-layer lens 72 can be formed using a planarized interlayer film region between the plurality of wiring layers 55 and the optical inner filter layer 62. In other words, the upwardly-convex inner-layer lens 72 is formed at a position corresponding to each of photodiodes (PD) 31 for IR, R, G, and B pixels on the interlayer film region. The inner-layer lens 72 may be formed of interlayer films with different reflective indexes, such as silicon dioxide films and silicon nitride films. For example, the inner-layer lens 72 includes an upwardly-convex first interlayer film 73, a second interlayer film 74 formed thereon, and an insulating interlayer 53 that forms the plurality of wiring layers 55 below the first interlayer film 73. The first interlayer film 73 may be formed of a silicon nitride film with a refractive index higher than the insulating interlayer (for example, silicon dioxide film) 53. In addition, the second interlayer film 74 may be a silicon dioxide film, an organic planarizing layer, or the like with a refractive index lower than that of the first interlayer film 73.

The formation of the optical inner filter layer 62 makes a distance (or thickness) from the light-receiving surface of the photodiode (PD) 31 to the on-chip microlens 66 large. In particular, as a result, oblique light may tend to be introduced into the adjacent pixel and cause color-mixing.

The CMOS solid-state imaging device 71 of the first embodiment includes the inner-layer lens 72 below the optical inner filter layer 62. Thus, the inner-layer lens 72 collects the oblique light and then allows it to be incident on the photodiode (PD) 31 of the target pixel 22. As a result, the sensitivity of device can be improved with an increase in efficiency of focusing light onto the photodiode (PD) 31. Simultaneously, a leakage of light into the adjacent pixel 22 can be prevented and the occurrence of color-mixing can be then suppressed.

As in the case of the present embodiment, in comparison with the case that the inner-layer lens 72 is formed above the optical inner filter layer 63, the formation of the inner-layer lens 72 below the optical inner filter layer 62 may be carried out so that light can be more sufficiently collected on the light-receiving surface of a photodiode (PD) 31 without changing the height from the light-receiving surface of the photodiode (PD) 31 to the on-chip microlens 66.

Furthermore, the occurrence of shading can be also suppressed. Besides, the use of an organic film as the planarizing layer 76 can prevent an increase in number of steps for the formation of such a layer.

When forming a planarizing layer with a silicon dioxide film, a silicon nitride film, or the like, two different steps, one for forming an insulating film and the other for chemical mechanical polishing (CMP) may be required. In contrast, according to the present embodiment, since a single step of organic-film coating may only be required, an increase in number of steps can be avoided.

Figure 10A:
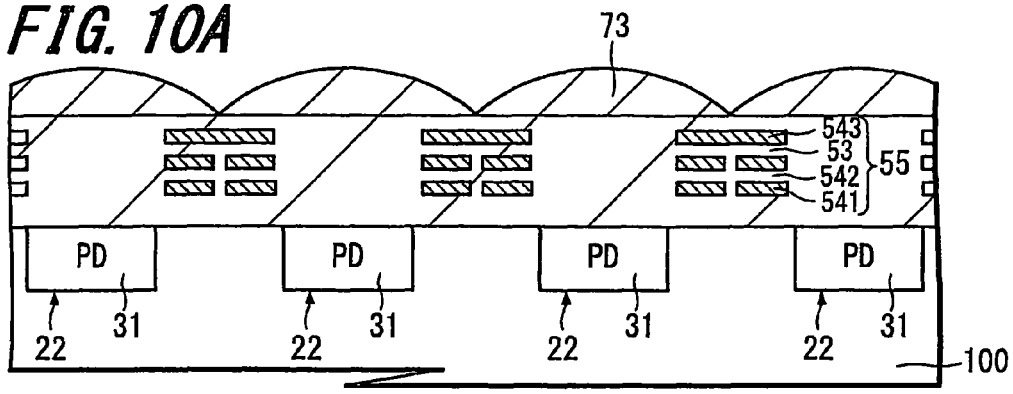
FIGS. 10A to 10C are process views illustrating a method of manufacturing the solid-state imaging device of the first embodiment of the present invention, where
Figure 10B:
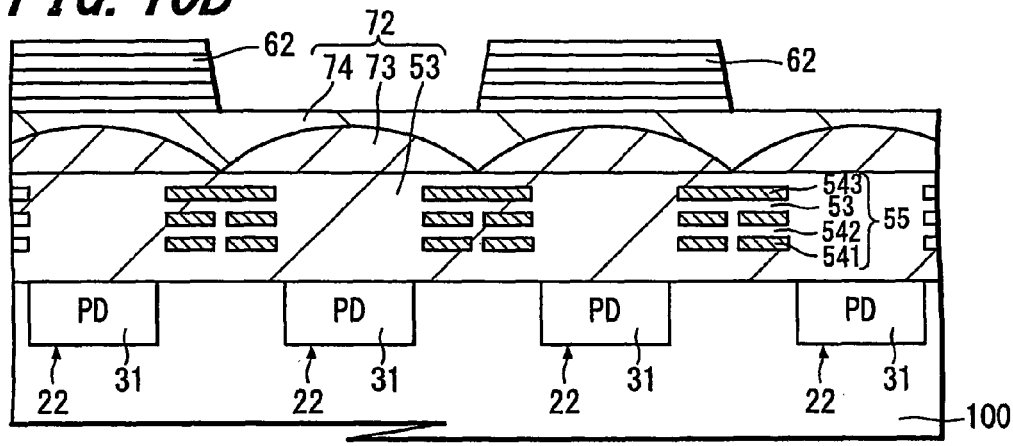
Figure 10C:
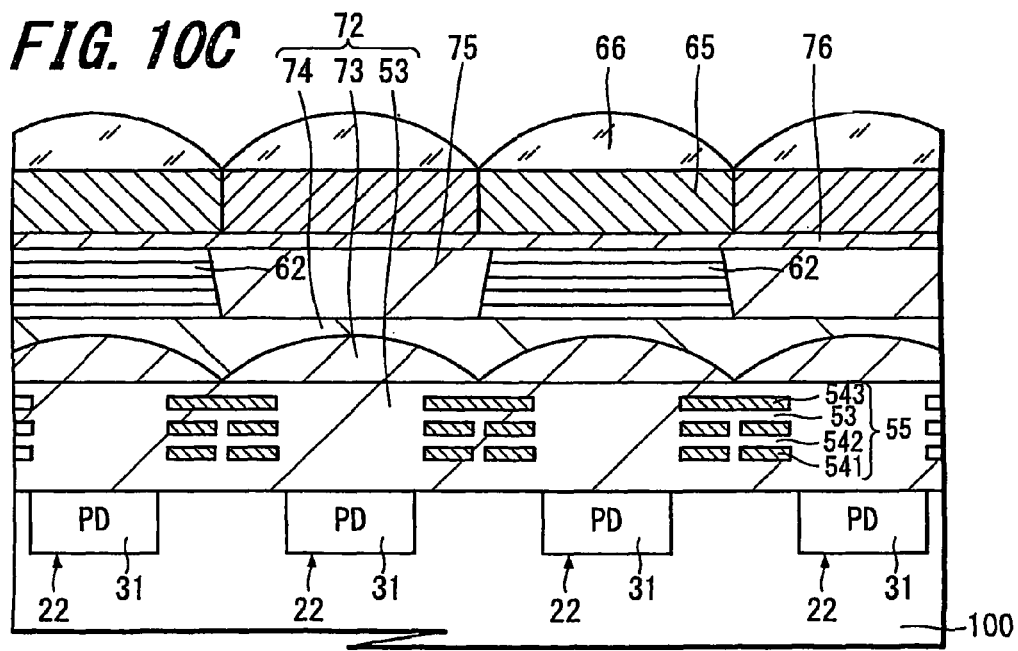

FIGS. 10A to 10C illustrate an example of a method of manufacturing a CMOS solid-state imaging device 71 according to the above first embodiment.

First, as shown in FIG. 10A, element-separating areas (not shown), pixels 22 with the respective photodiodes (PD) 31, and so on are formed on the principal surface of a semiconductor substrate 100, followed by the formation of a plurality of wiring layers 55. Here, the plurality of wiring layers 55 are formed of an insulating interlayer 53 and a plurality of wiring layers 54 (541, 542, and 543). A first interlayer film 73 in the form of an upwardly-convex lens is formed above the plurality of wiring layers 55, where the lens structures is provided corresponding to the position of the photodiodes (PD) 31 of the respective pixels 22.

Next, as shown in FIG. 10B, a second interlayer film 73 with a reflective index lower than that of the first interlayer film 73 is formed to planarize the first interlayer film 73. Subsequently, optical inner filter layers 62 are formed above R, G, and B pixels but not above an IR pixel, respectively. Thus, an inner-layer lens 72 can be formed of the first interlayer film 73 in lens shape, the second interlayer film 74 for planarization, and the insulating interlayer 53.

Next, as shown in FIG. 10C, a buried layer 75, such as a silicon dioxide film, is formed so that it can fill between adjacent optical inner filter layers 62, followed by planarizing by chemical mechanical polishing (CMP) or the like. Subsequently, an organic film is applied to form a planarizing layer 76. Then, color filters 65 and on-chip microlens 66 are formed sequentially, thereby obtaining a desired CMOS solid-state imaging device 71.

Figure 11:
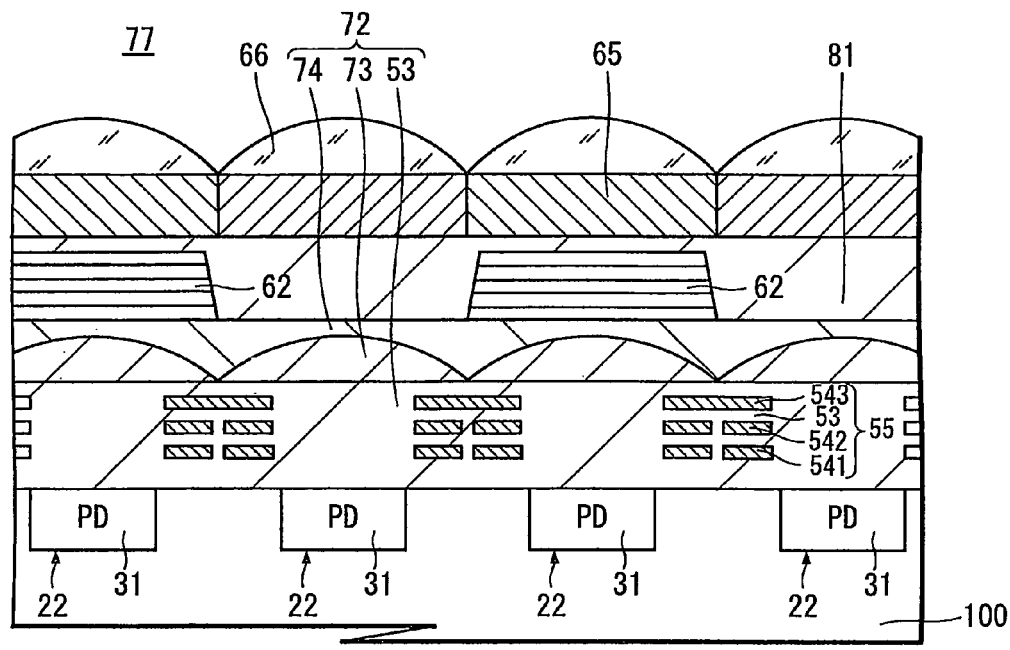
FIG. 11 is a schematic view illustrating main parts of a solid-state imaging device according to a second embodiment of the present invention.

FIG. 11 illustrates a CMOS solid-state imaging device according to a second embodiment of the present invention.

In a CMOS solid-state imaging device 77 of the present embodiment, a buried layer for filling between optical inner filer layers 62 and a planarizing layer are integrally formed with an organic film 81. Here, other structural components are similar to those in FIG. 7 as described above. Therefore, the same structural components in FIG. 11 are designated by the same reference numerals of the corresponding components in FIG. 7 and their duplicate descriptions will be omitted.

In the CMOS solid-state imaging device 77 of the second embodiment, the organic film 81 filling space between the adjacent optical inner filter layers 62 can also function as a planarizing layer on the layers 62. Thus, it leads to a reduction in number of manufacturing steps and a reduction in distance between the light-receiving surface and the on-chip microlens or a reduction in layer thickness, as well as no need of chemical mechanical polishing (CMP), etching, or the like. Other effects obtained by the formation of an inner-layer lens 72 below the optical inner filter layer 62, such as effects of an improvement in sensitivity, reduction of color-mixing, and reduction of shading, are the same as those of the above first embodiment.

Figure 12:
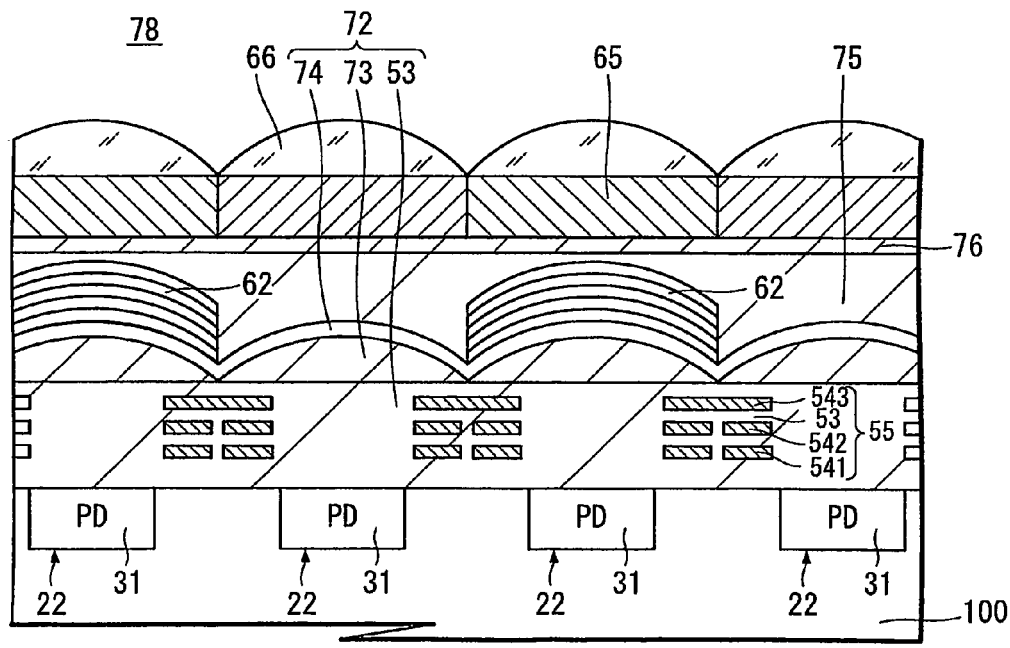
FIG. 12 is a schematic view illustrating main parts of a solid-state imaging device according to a third embodiment of the present invention.

FIG. 12 illustrates a CMOS solid-state imaging device according to a third embodiment of the present invention. In a CMOS solid-state imaging device 78 of the present embodiment, optical inner filter layers 62 have a lens shape copied from the lens shape of the corresponding inner-layer lens 72. In other words, an insulating interlayer 53, an upwardly-convex first interlayer film 73, and a second interlayer film 74 extending along the upper surface of the first interlayer film 73 form the inner-layer lens 72. In addition, the lens-shaped optical inner filter layer 62 is formed on the second interlayer film 74. Other structural components are the same as those represented in FIG. 7 as described above. Thus, these structural components in FIG. 12 are designated by the same reference numerals of the corresponding components in FIG. 7 and their duplicate descriptions will be omitted.

As described above, in the CMOS solid-state imaging device 78 according to the third embodiment, each of the optical inner filter layers 62 has a copied lens shape. Thus, the optical inner filter layer 62 itself acts as a lens to facilitate the collection of incident light. Other effects obtained by the formation of the inner-layer lens 72 below the optical inner filter layer 62, such as effects of an improvement in sensitivity, reduction of color-mixing, and reduction of shading, are the same as those of the above first embodiment.

Figure 8B:
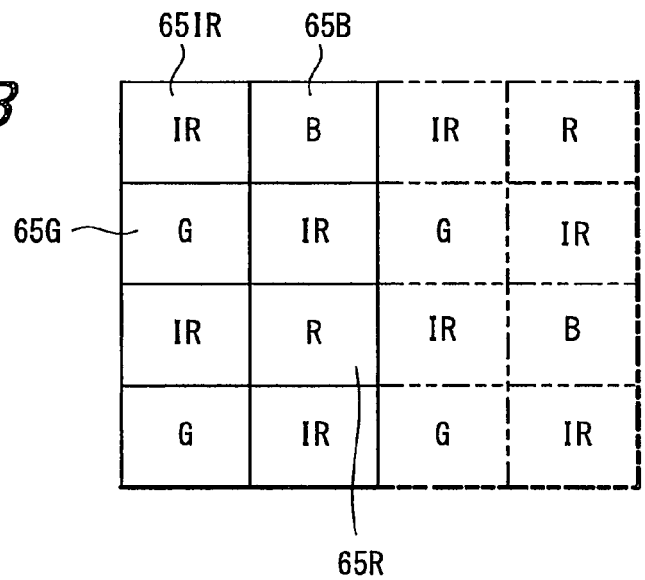
Figure 13:
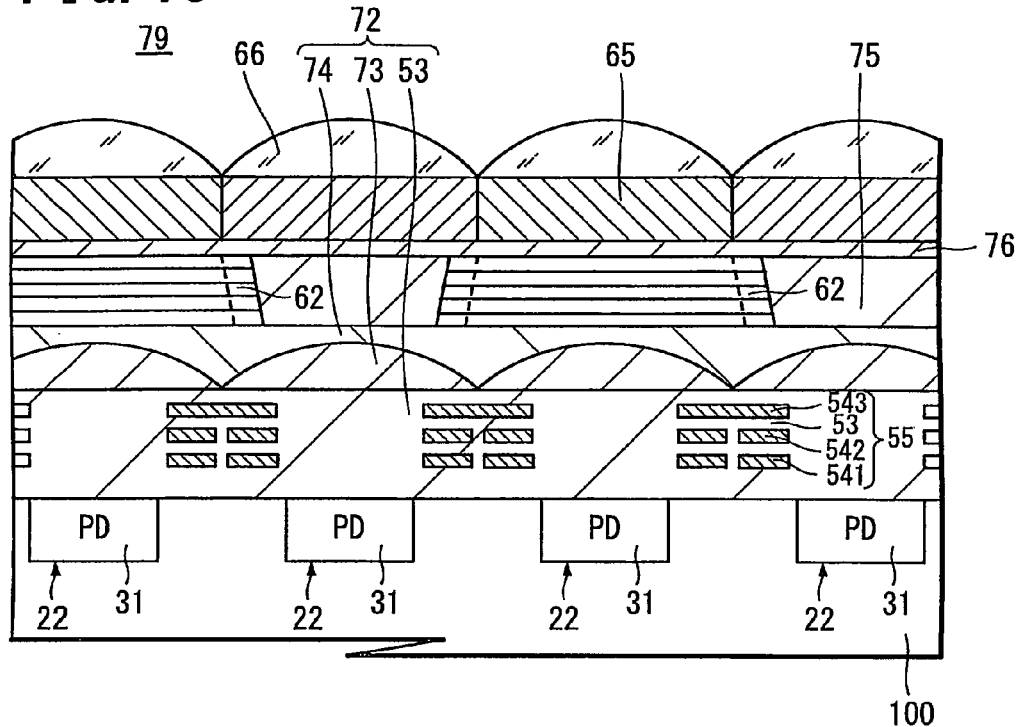
FIG. 13 is a schematic view illustrating main parts of a solid-state imaging device according to a fourth embodiment of the present invention.

FIG. 13 illustrates a CMOS solid-state imaging device according to a fourth embodiment of the present invention. A CMOS solid-state imaging device 79 includes optical inner filter layers 62 with surface areas larger than those of the corresponding pixels. In other words, the outline of the optical inner filter layer 62 extends toward the IR pixel. In this case, as shown in FIG. 8B, a color filter 65 may be one having a repetitive array of recurring units. Here, the recurring unit includes one pixel for a red (R) filter component 65R, two pixels for a green (G) filter component 65G, one pixel for a blue (B) filter component 65B, and four pixels for an infrared light (IR) filter component 65IR, respectively.

In the CMOS solid-state imaging device 79 according to the fourth embodiment, as described above, the outline of the optical inner filter layer 62 extends toward the IR pixel to reduce color-mixing with infrared light. Other effects obtained by the formation of an inner-layer lens 72 below the optical inner filter layer 62, such as effects of an improvement in sensitivity, reduction of color-mixing, and reduction of shading, are the same as those of the above first embodiment.

In the above embodiments, each pixel includes one photodiode (PD) and four pixel transistors as shown in FIG. 5. Alternatively, however, according to another example, a CMOS solid-state imaging device of a pixel-sharing type in which a plurality of photodiodes (PD) shares a pixel transistor (not shown) may be used.

Figure 14:
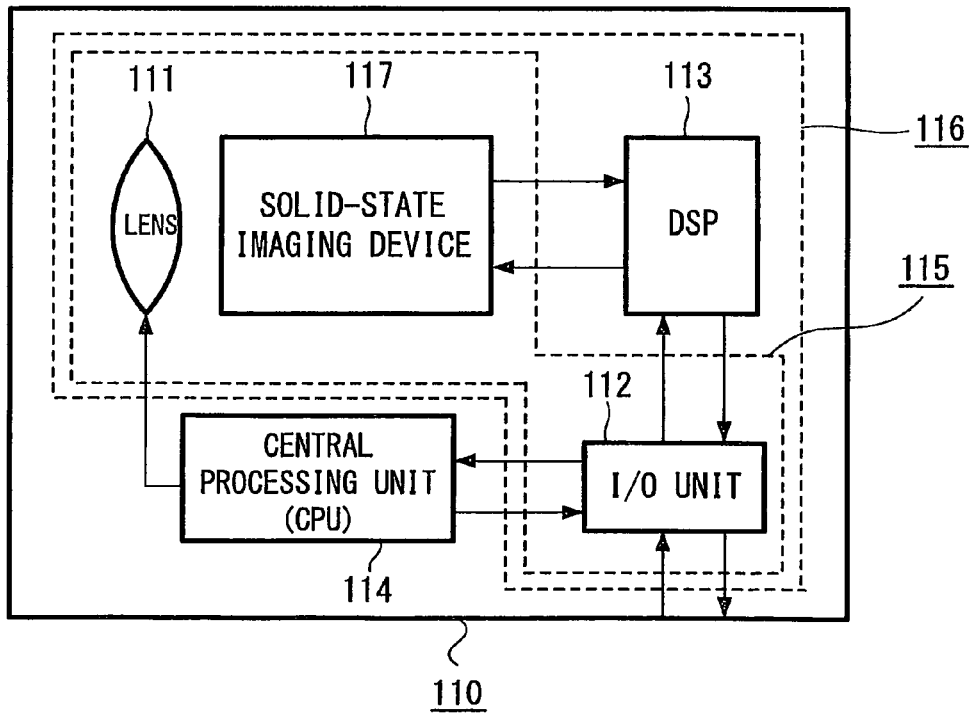
FIG. 14 is a schematic view illustrating a camera according to an embodiment of the present invention.

FIG. 14 illustrates a schematic configuration of a camera according to an embodiment of the present invention. A camera 110 includes in a single housing an optical lens system 111, an input-output (I/O) unit 112, a digital signal processor (DSP) 113, a central processing unit (CPU) 114 for the control of the optical lens system, and a solid-state imaging device 117 according to any of the above-described embodiments of the present invention. Alternatively, for example, a camera 115 according to an embodiment may be formed including the CMOS solid-state imaging device 117, the optical lens system 111, and the I/O unit 112. Alternatively, furthermore, a camera 116 according to an embodiment may be formed including the CMOS solid-state imaging device 117, the I/O unit 112, and the DSP 113. In addition, the configuration illustrated in FIG. 14 may be also applied to a camera module.

According to the configuration of the camera of the present embodiment, it is possible to obtain a camera capable of suppressing optical color-mixing with the adjacent pixel, improving the sensitivity thereof, and capturing an image of a dark subject brightly using infrared light.

Furthermore, the use of the CMOS solid-state imaging device according to any of the above-described embodiments of the present invention allows an imaging camera including thereof to be capable of suppressing optical color-mixing with the adjacent pixel, improving the sensitivity of the camera, and capturing an image of a dark subject brightly using infrared light.

In the above-described embodiments, reference numerals 71, 77, 78, and 79 denote CMOS solid-state imaging devices, 100 denotes a semiconductor substrate, 22 denotes an unit pixel, 31 denotes a photodiode (PD), 53 denotes an insulating interlayer, 54 (541, 542, and 543) denotes wiring layer, 55 denotes a plurality of wiring layers, 62 denotes an optical inner filter layer (infrared light blocking filter layer for), 65 denotes a color filter, 66 denotes an on-chip microlens, 72 denotes an inner-layer lens, 75 denotes a buried layer, 76 denotes a planarizing layer, and 81 denotes an organic film.

Figure 15:
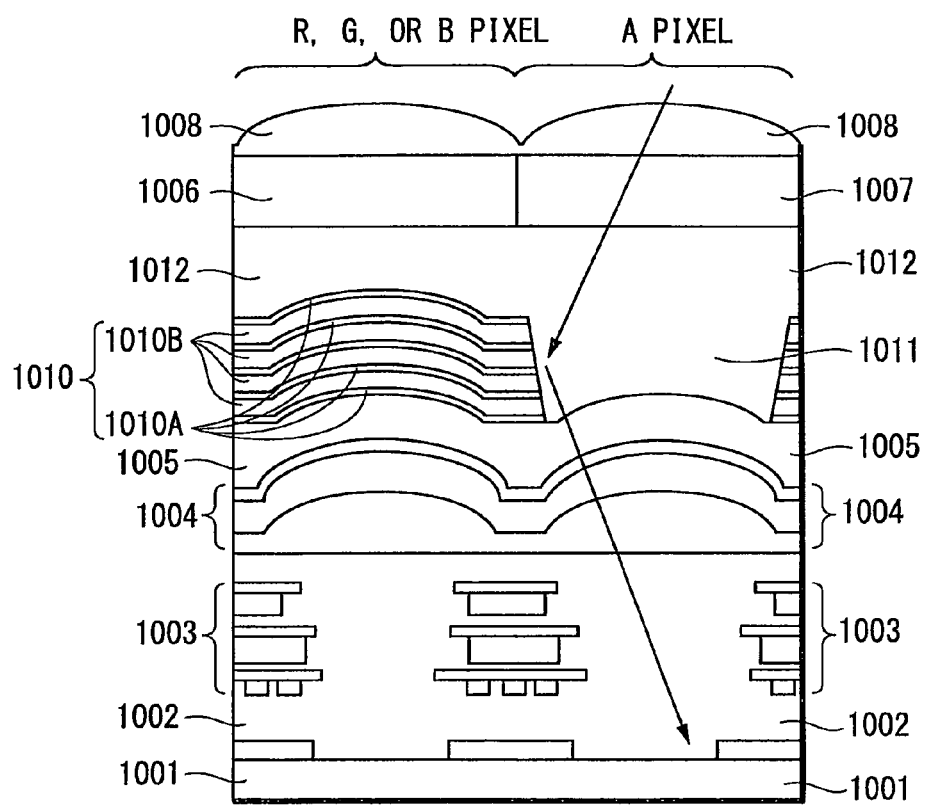
FIG. 15 is a schematic cross-sectional view illustrating a solid-state imaging device according to a fifth embodiment of the present invention.

FIG. 15 is a schematic cross-sectional view illustrating a solid-state imaging device according to a fifth embodiment of the present invention.

As shown in FIG. 15, a CMOS solid-state imaging device (CMOS image sensor) includes a silicon substrate 1001, an insulating layer 1002, a wiring layer 1003, an inner-layer lens 1004, a buried layer 1005, a color filter 1006, an on-chip lens 1008, an on-chip filter 1010, an optical waveguide 1011, and a buried layer 1012.

The solid-state imaging device includes light-receiving sections (not shown) in the silicon substrate 1001. These sections are formed of photodiodes (PD) and provided for their corresponding pixels, respectively.

Furthermore, the silicon substrate 1001 includes MOS transistors (e.g., charge-transfer transistors, amplification transistors, and pixel-selection transistors) in the pixels and other MOS transistors in a peripheral circuit.

The wiring layers 1003 are formed in the insulating layer 1002 above the silicon substrate 1001.

These wiring layers 1003 are metal wiring lines responsible for connecting the photodiodes (PD) or transistors (not shown) in the pixels to the peripheral or external circuits. Light passes through the wiring layers 1003 and then enters the light-receiving sections (photodiodes) in the silicon substrate 1001.

In FIG. 15, the insulating layer 1002 is represented as a single layer. Alternatively, it may be formed of a plurality of insulating layers formed of different materials or prepared by different procedures.

As shown in the figure, the on-chip lens 1008 is formed on the top of the CMOS solid-state imaging device.

The inner-layer lens 1004 is arranged in the middle of the height between the silicon substrate 1001 and the on-chip lens 1008, corresponding to each pixel. The inner-layer lens 1004 has a flat bottom surface and an upwardly-convex surface. In addition, the lens is flat in shape on the periphery of each pixel and the area between the adjacent pixels.

The inner-layer lens 1004 thus formed further collects the light previously collected by the on-chip lens 1008 and then leads the light to the light-receiving section of the silicon substrate 1001 corresponding to each pixel.

FIG. 15 is a cross-sectional view of part of the CMOS solid-state imaging sensor, showing structural components corresponding to two pixels. The pixel on the left side is a color pixel (R, G, or B pixel) for detecting a certain color in the visible light and the pixel on the right side is a pixel detecting visible light and infrared light (A pixel) for receiving and detecting the entire visible light and the infrared light.

The color pixel (R, G, or B pixel) is provided with a color filter 1006 for a pixel of certain color under the on-chip lens 1008.

The pixel detecting visible light and infrared light (pixel A) is provided with a transparent insulating layer 1007 but not with any color filter 1006 under the on-chip lens 1008.

The presence of both the color pixel (R, G, or B pixel) and the pixel detecting visible light and infrared light (pixel A) allows the CMOS solid-state imaging device to obtain a color image by a combination of the detection results from these pixels even when incident light is of a low level.

In particular, the solid-state imaging device of the present embodiment includes an on-chip filter 1010 including a plurality of stacked layers between the inner-layer lens 1004 and the color filter 1006 of the color pixel (R, G, or B pixel).

The on-chip filter 1010 shown in the figure is formed of two films 1010A and 1010B having different refractive indexes which are stacked alternately. Materials (or refractive indexes) and thicknesses of these two films 1010A and 1010B may be selected such that infrared light is blocked so as not to be incident on the light-receiving section of the silicon substrate 1001.

In addition, each of the films 1010A and 1010B has an upwardly-convex curved surface corresponding to the curved upper surface (convex surface) of the inner-layer lens 1004.

Furthermore, the on-chip filter 1010 has in most part, including the part corresponding to the center of the pixel, an upwardly-convex shape, while the part corresponding to the periphery of the pixel is substantially flat.

The transparent buried layer 105 is arranged between the inner-layer lens 1004 and the on-chip filter 1010.

Materials for the films 1010A and 1010B of the on-chip filter 1010 may be two materials having different refractive indexes selected from silicon carbide, silicon nitride, silicon oxide, silicon dioxide, hafnium oxide, titanium oxide, calcium fluoride, magnesium fluoride, zircon oxide, niobium oxide, aluminum oxide, zinc oxide, tin oxide, and indium tin oxide.

In addition, thicknesses of these films 1010A and 1010B may be selected corresponding to the wavelength of light to be blocked. For example, the thicknesses of these two films 1010A and 1010B of the on-chip filter 1010 may be selected to block infrared light.

The on-chip filter 1010 thus formed allows the device to omit an external filter such as one for blocking infrared light. Such a characteristic feature is the same as one obtained by the configuration of the device shown in FIG. 3B.

Without an external filter, an apparatus including a solid-state imaging device, such as a camera apparatus or a camera unit in a mobile phone unit, is allowed to be made light and small.

In the solid-state imaging device of the present embodiment, furthermore, the pixel detecting visible light and infrared light (A pixel) adjacent to the color pixel (R, G, or B pixel)

includes the optical waveguide 1011 for guiding incident light. The optical waveguide 1011 is formed at the same height as the on-chip filter 1010 for color pixel.

The optical waveguide 1011 is formed by embedding a hole formed by partially removing the plurality of layers of the on-chip filter 1010 on the transparent buried layer 1005 with the buried layer 1012. Here, the buried layer 1012 is made of a material having a refractive index different from that of the surrounding on-chip filter 1010. The buried layer 1012 fills and extends above the hole of the optical waveguide 1011. In contrast, in the color pixel, the space between the on-chip filter 1010 and the color filter 1006 is embedded with the buried layer 1012.

The optical waveguide 1011 has a lateral surface tapered as the width of the optical waveguide 1011 is reduced towards the bottom thereof.

Accordingly, as indicated by the arrows in the figure, light obliquely incident on the pixel detecting visible light and infrared light (A pixel) can be reflected on the lateral wall surface of the optical waveguide 1011. Thus, the light can be incident on the light-receiving section of the silicon substrate 1001. Therefore, an amount of light received by the pixel detecting visible light and infrared light (A pixel) increases, improving sensitivity of the A pixel.

Furthermore, the pixel detecting visible light and infrared light (A pixel) can receive and detect not only visible light but also infrared light, because the plurality of layers of the on-chip filter 1010 have been removed.

The buried layer 1012 of the optical waveguide 1011 is made of a selected material that transmits light detected by the pixel detecting visible light and infrared light and has a refractive index different from the refractive indexes of the materials forming the boundaries of the space to be embedded. Here, the boundaries of the space are formed with two different films 1010A and 1010B of the on-chip filter 1010.

The buried layer 1012 may be made of any of inorganic materials, such as silicon carbide, silicon nitride, silicon oxide, silicon dioxide, hafnium oxide, titanium oxide, calcium fluoride, magnesium fluoride, zircon oxide, niobium oxide, aluminum oxide, zinc oxide, tin oxide, and indium tin oxide. Alternatively, the material of the buried layer 1012 may be a polymer binder prepared by dispersing a material having a high refractive index in an organic polymer material.

Figure 1:
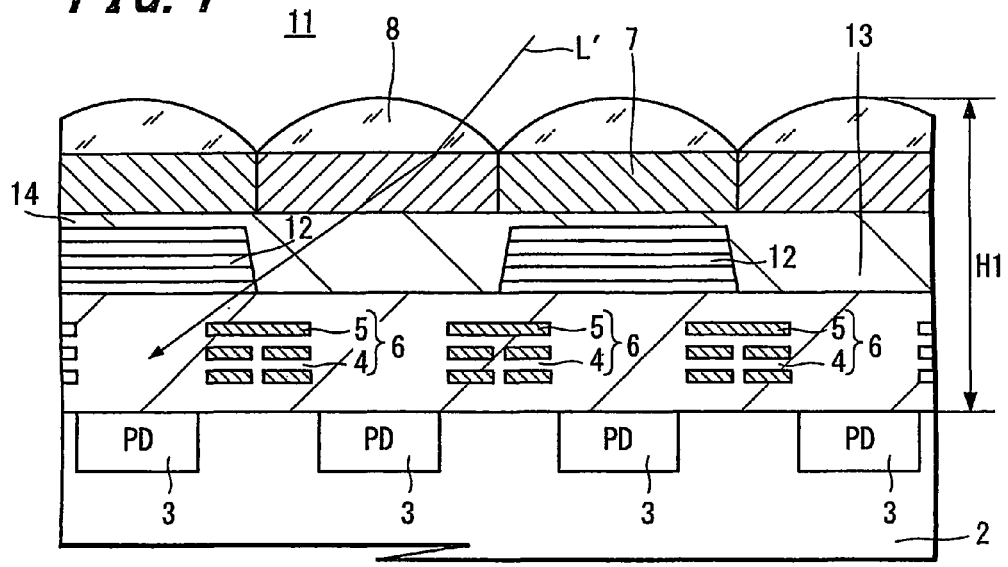
FIG. 1 is a schematic view illustrating main parts of an example of a related-art CMOS solid-state imaging device with an optical inner filter layer for blocking infrared light.
Figure 2:
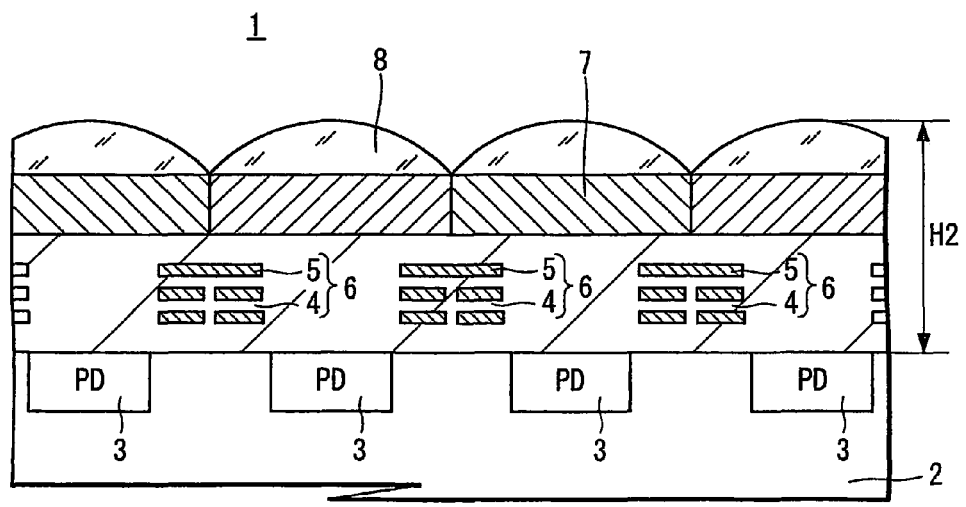
FIG. 2 is a schematic view illustrating main parts of an example of a related-art CMOS solid-state imaging device without an optical inner filter layer for blocking infrared light.
Figure 3A:
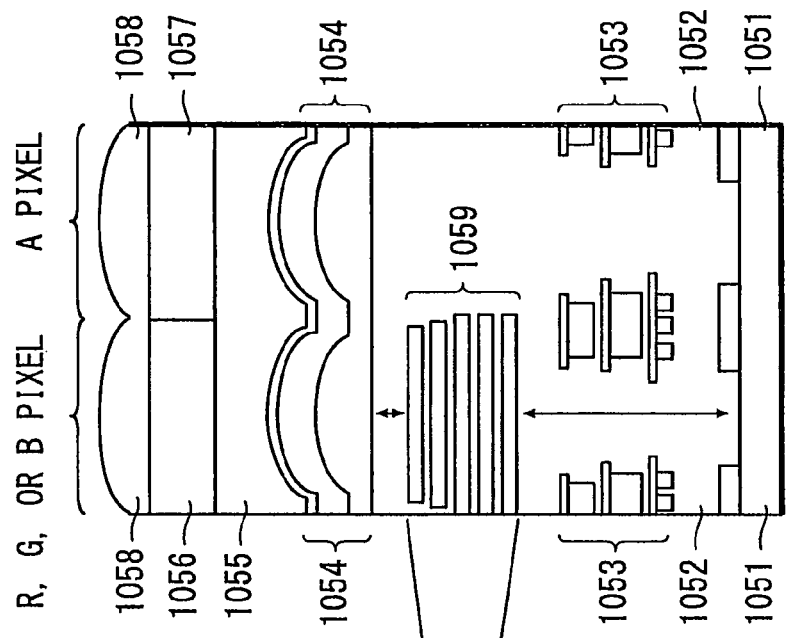
FIGS. 3A and 3B are schematic cross-sectional views illustrating a solid-state imaging device, where

The solid-state imaging device according to the embodiment shown in FIG. 15 can be manufactured, for example, as follows:

First, a silicon substrate 1001, an insulating layer 1002, a wiring layer 1003, and an inner-layer lens 1004 are formed as in the case with the configuration of the related art in which an on-chip filter is not provided as shown in FIG. 3A.

Second, a transparent buried layer 1005 is formed above the inner-layer lens 1004. Here, the thickness of the transparent buried layer 1005 is selected so that the upper surface thereof is curved along the curved upper surface of the inner-layer lens 1004.

Subsequently, an on-chip filter 1010 including a plurality of layers is formed above the embedded layer 1005. Specifically, two different films 1010A and 1010B are stacked alternately. After that, by photolithography process, the entire surface of the on-chip filter 1010 including the area for each color pixel (R, G, or B) but for pixel detecting visible light and infrared light (A pixel) is covered with a mask and then selectively etching the on-chip filter 1010 on the A pixel. Such etching can be carried out readily using a typical dry etching technology or wet etching technology. Thus, a hole is formed by removal of part of the on-chip filter 1010 corresponding to the A pixel. In this case, suitable etching conditions can be selected to obtain a tapered hole, that is, the lateral wall surface of the hole having a desired angle of inclination.

Next, the hole formed by removal of the part of the on-chip filter 1010 corresponding to the pixel detecting visible light and infrared light (A pixel) is filled with an appropriate material for a buried layer 1012. Here the material has a refractive index different from that of the surrounding on-chip filter 1010. Subsequently, the material is further applied, thereby forming the buried layer 1012 on the whole area.

Moreover, the surface of the buried layer 1012 is planarized. Subsequently, a color filter 1006 with a color corresponding to the color pixel (R, G, or B pixel) is formed on the planarized surface of the buried layer 1012. For the pixel detecting visible light and infrared light (A pixel), a transparent insulating layer 1007 is formed instead of the color filter 1006.

Subsequently, for each pixel, an on-chip lens 1008 is formed.

Consequently, the solid-state imaging device as shown in FIG. 15 can be manufactured.

As described above, the solid-state imaging device of the present embodiment includes the on-chip filter 1010 with a plurality of layers 1010A and 1010B for blocking infrared light. The on-chip filter 1010 has a central part whose surface is curved (i.e., upwardly-convex part) and a substantially planarized peripheral part around the center part. Therefore, such characteristic features of the solid-state imaging device will cause the following two advantageous effects for improving the properties of the device.

The first effect is to further collect light incident on any pixel because the central part of the on-chip filter 1010 is provided with a lens function due to its convex shape. In other words, the device is provided with the on-chip filter 1010 as a third lens in addition to the on-chip lens 1008 and the inner-layer lens 1004. Thus, light can be collected onto the light-receiving section of the silicon substrate 1001 even though the formation of the on-chip filter 1010 may result in an increase in height of the device and an increase in aspect ratio.

Figure 3B:
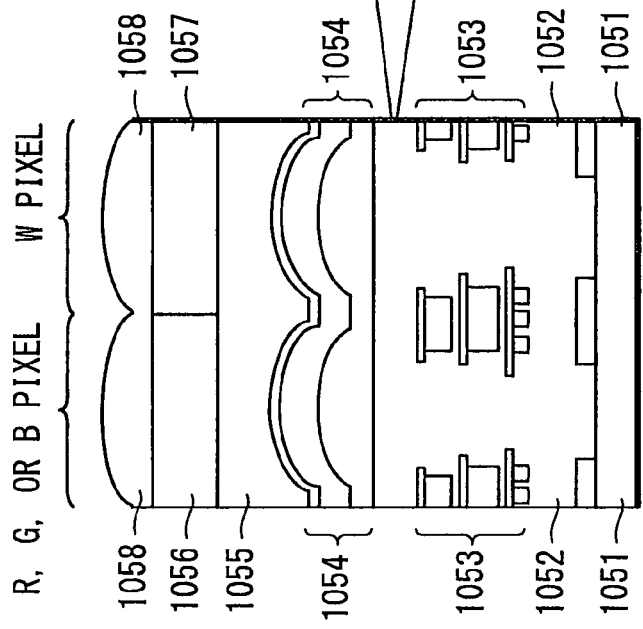

Therefore, in contrast to the configuration of the device shown in FIG. 3B where the flat on-chip filter 1059 is formed, the device of the present embodiment can further collect the incident light, suppressing leakage of light into the adjacent pixels and resulted color-mixing.

With the curved structure including a plurality of layers of the on-chip filter 1010, the second effect is to prevent the circulation of light incident between two boundaries, such as those represented by the arrows in FIG. 3B. In other words, even if light is incident between two boundaries, the dispersion of light will occur while the light reflects on the boundaries, because at least the boundary surface of the on-chip filter 1010 is curved.

In the wavelength spectrum of light received and detected by the color pixel, such an effect can greatly suppress the generation of undesired waveform undulation and lower such an undulation to a negligible level. Therefore, the device of the present embodiment can reproduce a true color in color reproduction.

Furthermore, since any undesired waveform undulation in the wavelength spectrum can be lowered to a negligible level, any influence on the wavelength spectrum due to variations in thicknesses of layers can be substantially avoided during the production.

Therefore, the device of the present embodiment can be manufactured in a stable manner with an improvement in production yield.

Furthermore, the device of the present embodiment can produce an image of improved quality because it suppresses occurrence of color-mixing and reproduces true colors correctly.

In the configuration of the solid-state imaging device of the present embodiment, as described above, the optical waveguide 1011 is embedded with the buried layer 1012 made of a material having a refractive index higher than that of the surrounding layers in the pixel detecting visible light and infrared light (A pixel).

In addition, the lateral wall of the optical waveguide 1011 is sloped to form a tapered structure gradually narrowing to the bottom.

Therefore, the light obliquely incident on the pixel detecting visible light and infrared light (A pixel) can be reflected on the lateral wall of the optical waveguide 1011 and then incident on the light-receiving section of the silicon substrate 1001.

Moreover, light can be collected on the light-receiving section of the silicon substrate 1001 even though the formation of on-chip filter 1010 may result in an increase in height of the device and an increase in aspect ratio.

Therefore, the sensitivity of the pixel detecting visible light and infrared light (A pixel) can be improved with the increased amount of light received by the A pixel.

As described above, the formation of both the curved on-chip filter 1010 in the color pixel (R, G, or B pixel) and the tapered optical waveguide 1011 in the pixel detecting visible light and infrared light (A pixel) can contribute to reduction of disadvantages caused by an increase in height of the device due to the formation of the on-chip filter 1010.

In other words, the device of the present embodiment can keep the occurrence of color-mixing at almost the same level as that of the related-art device having no on-chip filter even though the formation of the on-chip filter 1010 causes an increase in height of the device.

Furthermore, as described above, the solid-state imaging device of the present embodiment includes the on-chip filter 1010 formed above the inner-layer lens 1004 having a curved upper surface through the buried layer 1005. Thus, the on-chip filter 1010 can be easily formed in a curved shape by faithfully reproducing the curved shape of the upper surface of the inner-layer lens 1004 onto the on-chip filter 1010.

Furthermore, as described above, the solid-state imaging device of the present embodiment allows each pixel to collect light by the actions of the on-chip filter 1010 and the lateral wall surface of the optical waveguide 1011. Thus, the light can be incident on the light-receiving section of the silicon substrate 1001, while suppressing the occurrence of color-mixing and improving a shading property.

Here, the response intensity of the shading is characteristically the maximum at the center of the sensor, where incident light is collected by an external lens, and the minimum at the corner of the sensor.

Therefore, the more the pixel is far from the center of the sensor, the more the incident angle of light becomes acute. Thus, any uncorrected image may become dark at the corner or end portion of the sensor in contrast to the central part of the sensor.

Needless to say, if a difference in response between the central and corner portions is comparatively small, any image correction may be performed. If such a difference is significant, a difference in brightness becomes large and the image correction can be thus hardly carried out.

Here, the occurrence of shading was investigated on each of the configuration of the device of the present embodiment as shown in FIG. 15 and the configuration of the device with the related-art on-chip filter as shown in FIG. 3B.

Figure 16:
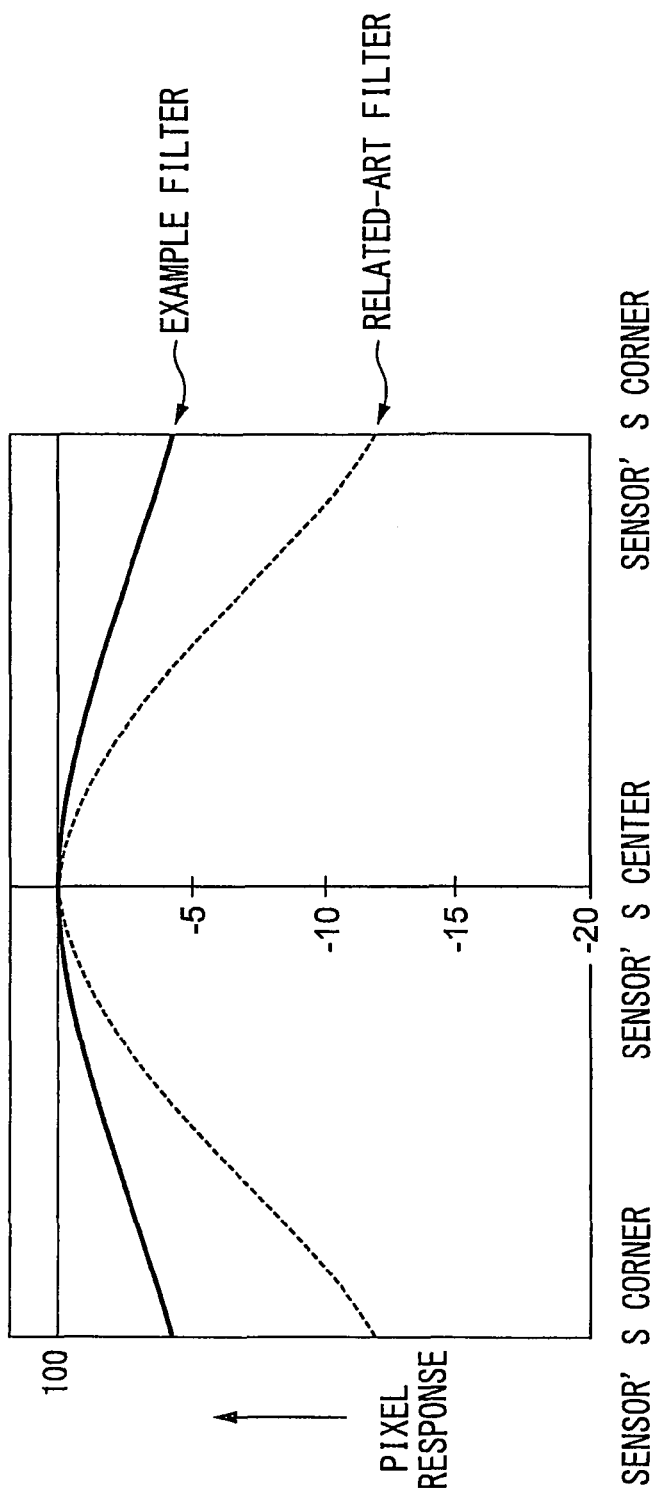
FIG. 16 is a graph representing the results of a measurement for investigating the state of occurrence of shading in each of the solid-state imaging device shown in FIG. 15 and the solid-sate imaging device shown in FIG. 3B.

The results of the investigation are shown in FIG. 16. In this figure, the horizontal axis indicates positions on the diagonal line of a rectangular sensor in the image sensor (solid-state imaging device). The center of the horizontal axis corresponds to the central portion of the sensor, while the right and left thereof corresponding to the opposite corners of the sensor. The vertical axis of the graph represents the response (output) of a pixel. The response of the pixel is standardized so that it takes a value of 100 at the sensor center. In the figure, the "example filter" represents the results of the measurement on the device of the present embodiment as shown in FIG. 15 and the "related-art filter" represents the results of the measurement on the device with the related-art on-chip filter as shown in FIG. 3B.

As shown in FIG. 16, the response of the related-art filter (on-chip filter 1059 made of a planar stacked film) is greatly dropped at the corner of the sensor. If the response falls to such a level, it becomes difficult to perform the correction.

On the other hand, in the case of the example filter of the present embodiment (curved on-chip filter 1010 in FIG. 15), the level of shading is reduced almost one third of the related-art filter. In other words, the reduction of shading in the present filter is within the levels leading to more easy correction.

Furthermore, as described above, the solid-state imaging device according to the embodiment of the present invention includes the on-chip filter 1010 having an almost planarized portion on the periphery of the pixel in addition to a curved portion continuously formed with the planarized portion. Thus, the device of the present embodiment has an advantage in that light incident between the stacked films can be prevented from becoming stray light directed toward the light-receiving section of the pixel.

Figure 17:
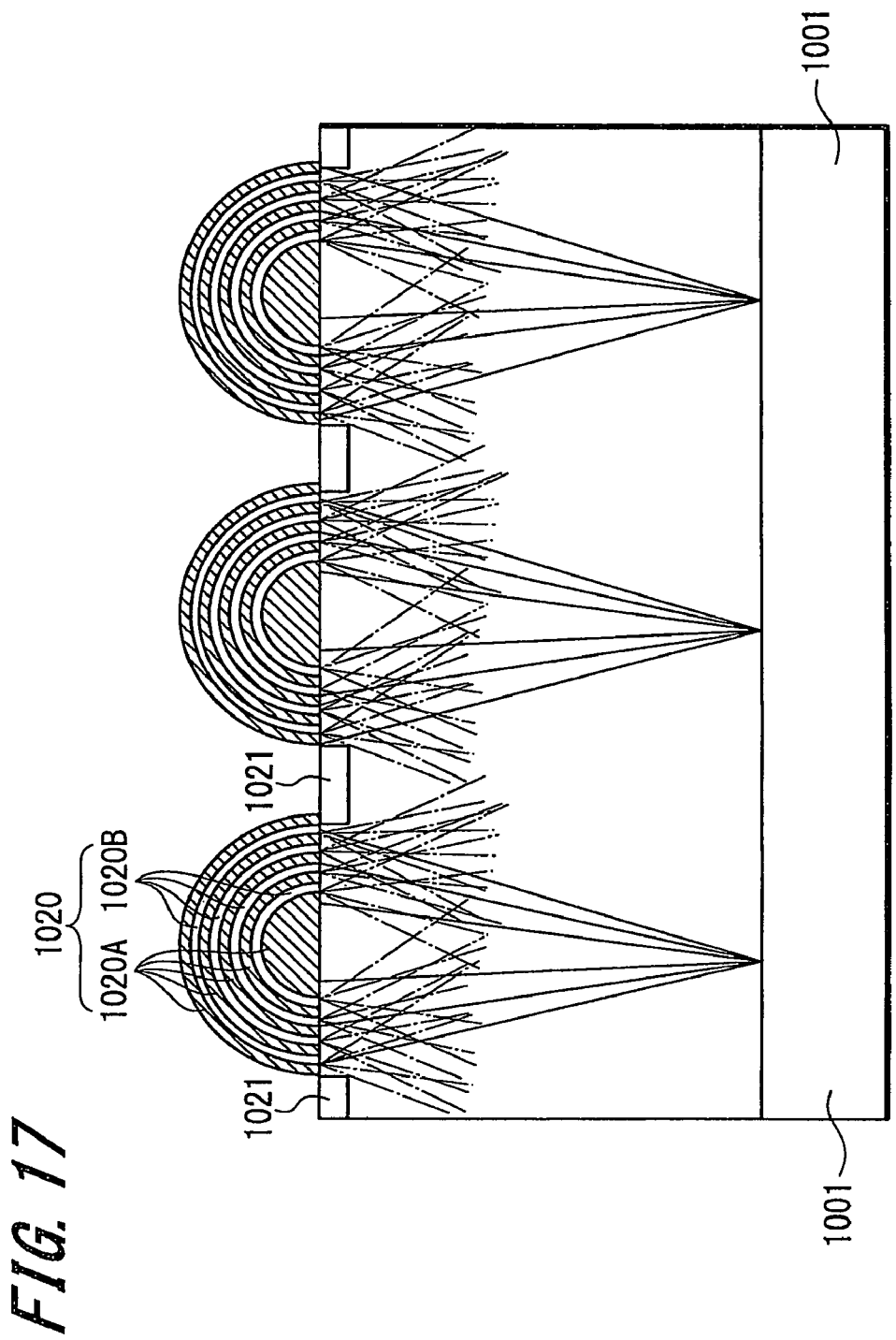
FIG. 17 is a schematic cross-sectional view illustrating light generated through the on-chip filter only having a curved surface portion.

Here, FIG. 17 is a schematic view representing an on-chip filter having only a curved portion as a comparative example for the present embodiment.

As shown in FIG. 17, an on-chip filter 1020 formed of a stacked film including two different films 1020A and 1020B with different refractive indexes is provided in a spherical shape. A shading film 1021 is a film for blocking light that may not pass through the on-chip filter 1020.

Ordinary light represented by the solid line is collected using the lens function of the spherical on-chip filter 1020 and then incident on a silicon substrate having a light-receiving section (not shown). However, there is light incident on one of the stacked films 1020A and 1020B, for example, incident on the second film 1020B. The incident light travels along the spherical second film 1020B and then is scattered after output thereof as represented by the dashed dotted lines in the figure, followed by downwardly directed to the silicon substrate 1001. When the light (stray light) enters the light-receiving section, it becomes noise for the ordinary light. In addition, when it enters the light-receiving section of the adjacent pixel, it may also become a cause of color-mixing.

Figure 18:
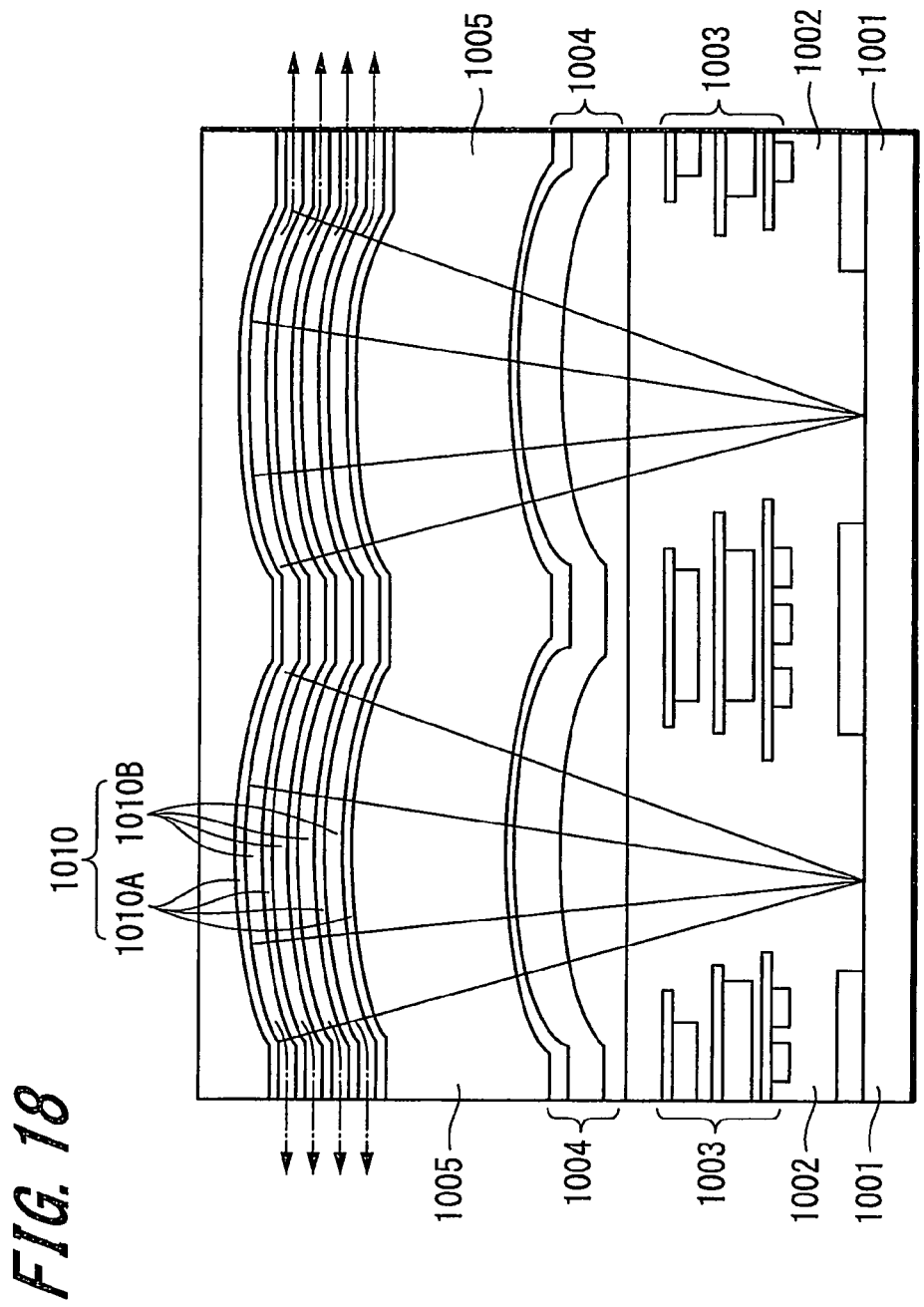
FIG. 18 is a schematic cross-sectional view illustrating light generated through the solid-state imaging device shown in FIG. 15.

In contrast, the configuration of the solid-state imaging device of the present embodiment is illustrated in FIG. 18.

As shown in FIG. 18, when light is incident on one of the stacked films 1010A and 1010B of the on-chip filter 1010, for example by the second film 1010B, the light travels in the horizontal direction and may not be directed to the silicon substrate 1001 where the light-receiving section is formed.

The pixel detecting visible light and infrared light (A pixel) includes the buried layer 1012 instead of having any on-chip filter 1010. In this case, even when the light traveling in the horizontal direction shown in FIG. 18 enters the buried layer

1012, the amount of light being directed to the silicon substrate 1001 is negligible because of refraction or scattering.

Therefore, in the solid-state imaging device of the present embodiment, the on-chip filter 1010 is almost planarized on the peripheral part of the pixel and continuously formed with the curved portion. Thus, light incident between the stacked films 1010A and 1010B can be prevented from being directed toward the light-receiving section of the pixel.

Hereinafter, the configurations of solid-state imaging devices according to other embodiments of the present invention will be described.

Figure 19:
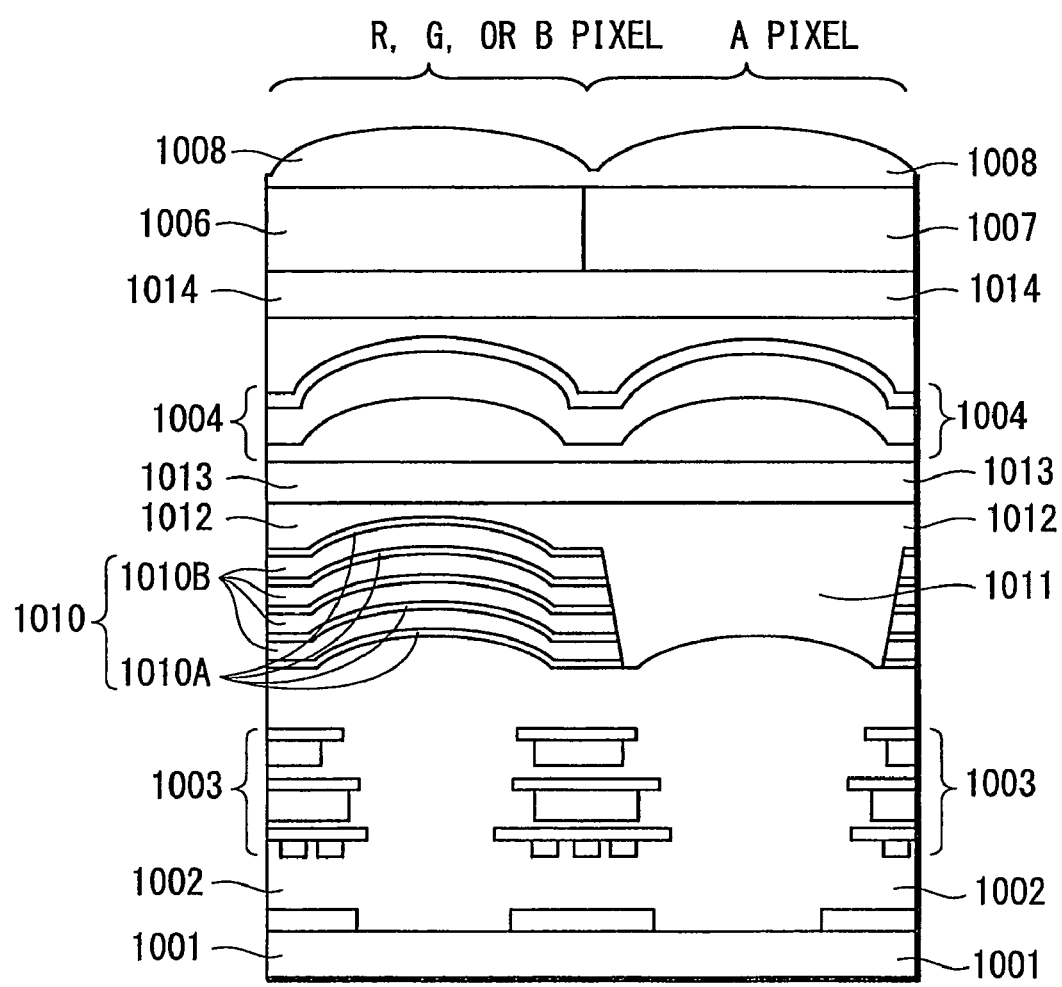
FIG. 19 is a schematic cross-sectional view illustrating a solid-state imaging device according to a sixth embodiment of the present invention.

FIG. 19 is a schematic cross-sectional view of a solid-state imaging device according to a sixth embodiment of the present invention. In this embodiment, a refractive-index adjusting layer 1013 is provided.

In the present embodiment, as compared with the configuration of the embodiment shown in FIG. 15, the vertical relationship between the inner-layer lens 1004 and the on-chip filter 1010 is inverted. In other words, the on-chip filter 1010 is located below the inner-layer lens 1004.

The on-chip filter 1010 (including films 1010A and 1010B) is formed on an insulating layer 1002 having a curved upper surface.

The refractive-index adjusting layer 1013 is formed between a buried layer 1012 forming an optical waveguide 1011 and an inner-layer lens 1004. The refractive-index adjusting layer 1013 optically connects the inner-layer lens 1004 to the buried layer 1012 by adjusting the refractive index on their boundary.

In addition, a color filter 1006 is located above the inner-layer lens 1004, while a reciprocal connection layer 1014 for making a connection between the inner-layer lens 1004 and the color filter 1006 is formed under the color filter 1006.

Here, other structural components are similar to those shown in FIG. 15 as described above. Therefore, the same structural components in FIG. 19 are designated by the same reference numerals of the corresponding components in FIG. 15 and their duplicate descriptions will be omitted.

In the case of the sixth embodiment, there may be a need of forming the upper surface of the insulating layer 1002 into a curved surface to provide the on-chip filter 1010 with a curved surface. Thus, a step for forming the curved upper surface of the insulating layer 1002 may be carried out in the manufacturing process. Therefore, the manufacturing process for the sixth embodiment may require more steps than that of the fifth embodiment and take time and effort.

The configuration of the solid-state imaging device of the present embodiment will exert the following effects as in the case of the aforementioned embodiments.

In other words, occurrence of color-mixing can be suppressed. It is possible to keep the level of color-mixing at least at the same level as that of the related-art device having no on-chip filter even though the height of the device is increased by the formation of the on-chip filter 1010.

In addition, the device reproduces true colors correctly in the process of color reproduction. Thus, it becomes possible to obtain an image with improved quality. Furthermore, there is no substantial influence of variations in thickness on the wavelength spectrum at the time of the production. Therefore, the device of the present embodiment can be manufactured in a stable manner with an improvement in production yield.

Furthermore, the shading property of the device can be improved.

Moreover, light incident between the stacked films 1010A and 1010B of the on-chip filter 1010 can be prevented from being directed toward the light-receiving section of the pixel.

Figure 20:
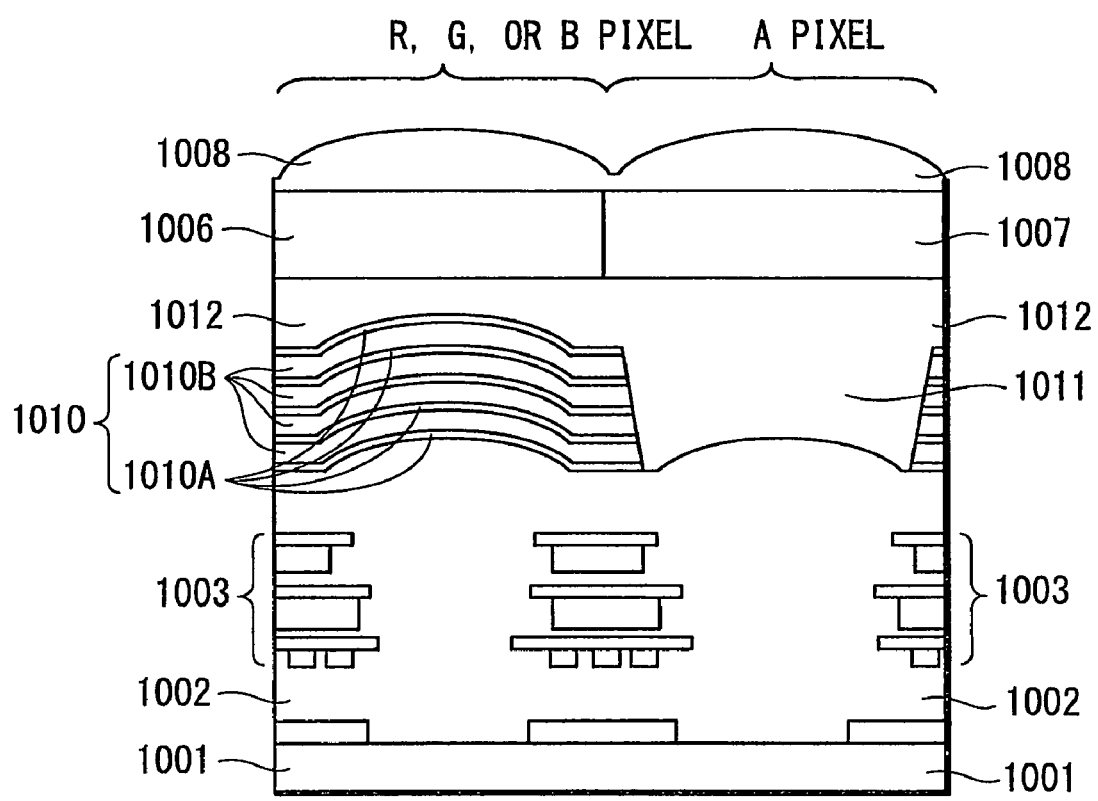
FIG. 20 is a schematic cross-sectional view illustrating a solid-state imaging device according to a seventh embodiment of the present invention.

Next, FIG. 20 is a schematic cross-sectional view of a solid-state imaging device according to a seventh embodiment of the present invention.

The device of the present embodiment may not include any inner-layer lens 1004 as compared to the device of the fifth embodiment shown in FIG. 15. Thus, the entire height of the device of the present embodiment is lower than that of the fifth embodiment, because the inner-layer lens 1004 is absent.

Here, other structural components are similar to those of the fifth embodiment shown in FIG. 15 as described above. Therefore, the same structural components in FIG. 20 are designated by the same reference numerals of the corresponding components in FIG. 15 and their duplicate descriptions will be omitted.

In the seventh embodiment, there may be a need of forming the curved upper surface of the insulating layer 1002 to provide the on-chip filter 1010 whose surface is curved. Thus, a step for forming the curved upper surface of the insulating layer 1002 may be carried out in the manufacturing process.

The configuration of the solid-state imaging device of the present embodiment will exert the following effects as in the case of the aforementioned embodiments.

In other words, occurrence of color-mixing can be suppressed. The formation of on-chip filter 1010 makes possible to keep the level of color-mixing at least at the same level as that of the related-art device having no on-chip filter even though the height of the device is increased by the formation of the on-chip filter 1010.

In addition, the device reproduces true colors correctly in the process of color reproduction. Thus, it becomes possible to obtain an image with improved quality. Furthermore, there is no substantial influence of variations in thickness on the wavelength spectrum at the time of the production. Therefore, the device of the present embodiment can be manufactured in a stable manner with an improvement in production yield.

Furthermore, the shading property of the device can be improved.

Moreover, light incident between the stacked films 1010A and 1010B of the on-chip filter 1010 can be prevented from being directed toward the light-receiving section of the pixel.

Figure 21:
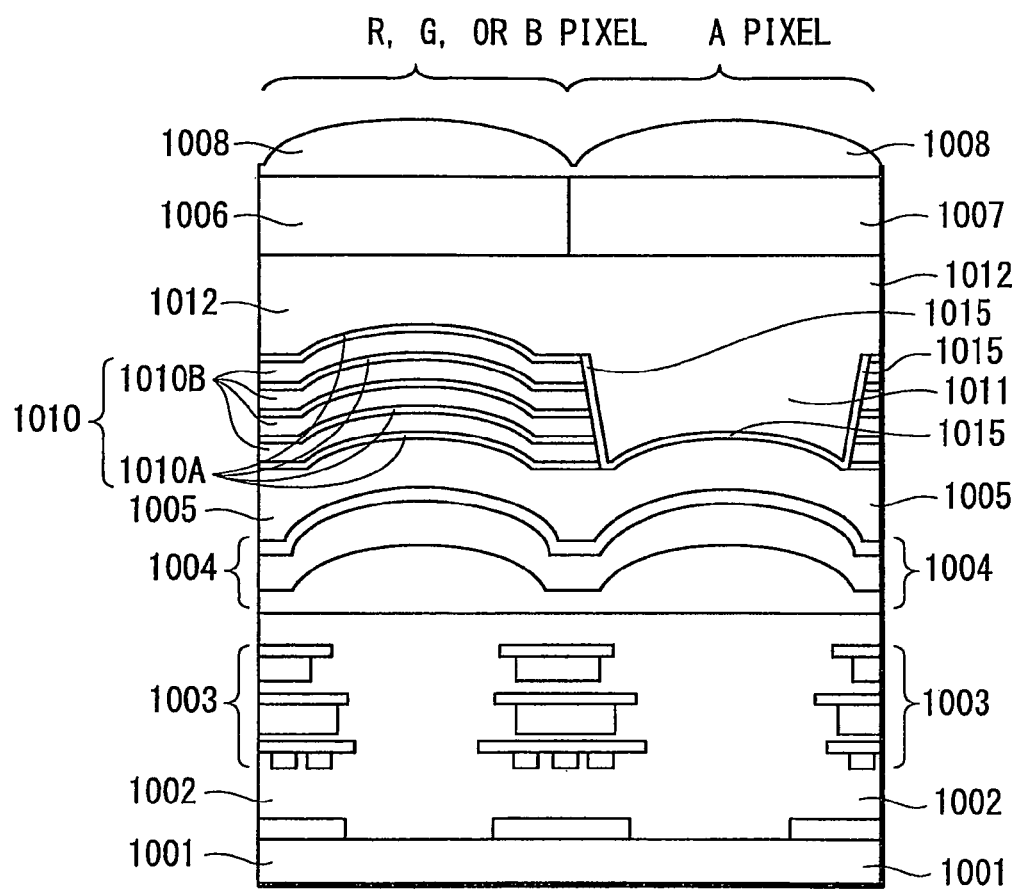
FIG. 21 is a schematic cross-sectional view illustrating a solid-state imaging device according to an eighth embodiment of the present invention.

Next, FIG. 21 is a schematic cross-sectional view of a solid-state imaging device according to an eighth embodiment of the present invention. In the figure, a high refractive index layer 1015 is provided.

The device of the present embodiment includes the high refractive index layer 1015 in addition to the structural components of the fifth embodiment as shown in FIG. 15. In other words, the high refractive index layer 1015 is made of a material with a high refractive index and formed on each of the lateral wall surfaces and bottom of the optical waveguide 1011.

More specifically, the high refractive index layer 1015 is made of a material with a refractive index higher than that of the material of the surrounding layers, such as the inside of the optical waveguide 1011 or the transparent buried layer 1005.

The high refractive index layer 1015 can be formed by forming a hole in the optical waveguide 1011 and applying a high refractive material to the entire surface of the hole (lateral wall surface and bottom thereof).

Here, other structural components are similar to those of the fifth embodiment as shown in FIG. 15. Therefore, the same structural components in FIG. 21 are designated by the same reference numerals of the corresponding components in FIG. 15 and their duplicate descriptions will be omitted.

The configuration of the solid-state imaging device of the present embodiment will exert the following effects as in the case of the aforementioned embodiments.

In other words, occurrence of color-mixing can be suppressed. Besides, it is possible to keep the level of color-mixing at least at the same level as that of the related-art device having no on-chip filter even though the height of the device is increased by the formation of the on-chip filter 1010.

In addition, the device reproduces true colors correctly in the process of color reproduction. Thus, it becomes possible to obtain an image with improved quality. Furthermore, there is no substantial influence of variations in thickness on the wavelength spectrum at the time of the production. Therefore, the device of the present embodiment can be manufactured in a stable manner with an improvement in production yield.

Furthermore, the shading property of the device can be improved.

Moreover, light incident between the stacked films 1010A and 1010B of the on-chip filter 1010 can be prevented from being directed toward the light-receiving section of the pixel.

As described above, furthermore, the solid-state imaging device of the present embodiment includes in particular the high refractive index layer 1015 on each of the lateral wall surfaces and bottom of the optical waveguide 1011.

Therefore, light incident on the lateral wall surfaces of the optical waveguide 1011 can be reflected on the boundaries between the high refractive index layer 1015 and the stacked films 1010A and 1010B of the on-chip filter 1010.

Thus, since the device of the eighth embodiment can increase the amount of light reflecting on the lateral wall surfaces of the optical waveguide 1011, the amount of light directed to the light-receiving section of a silicon substrate 1001 can be increased as compared to the fifth embodiment shown in FIG. 15.

Figure 22:
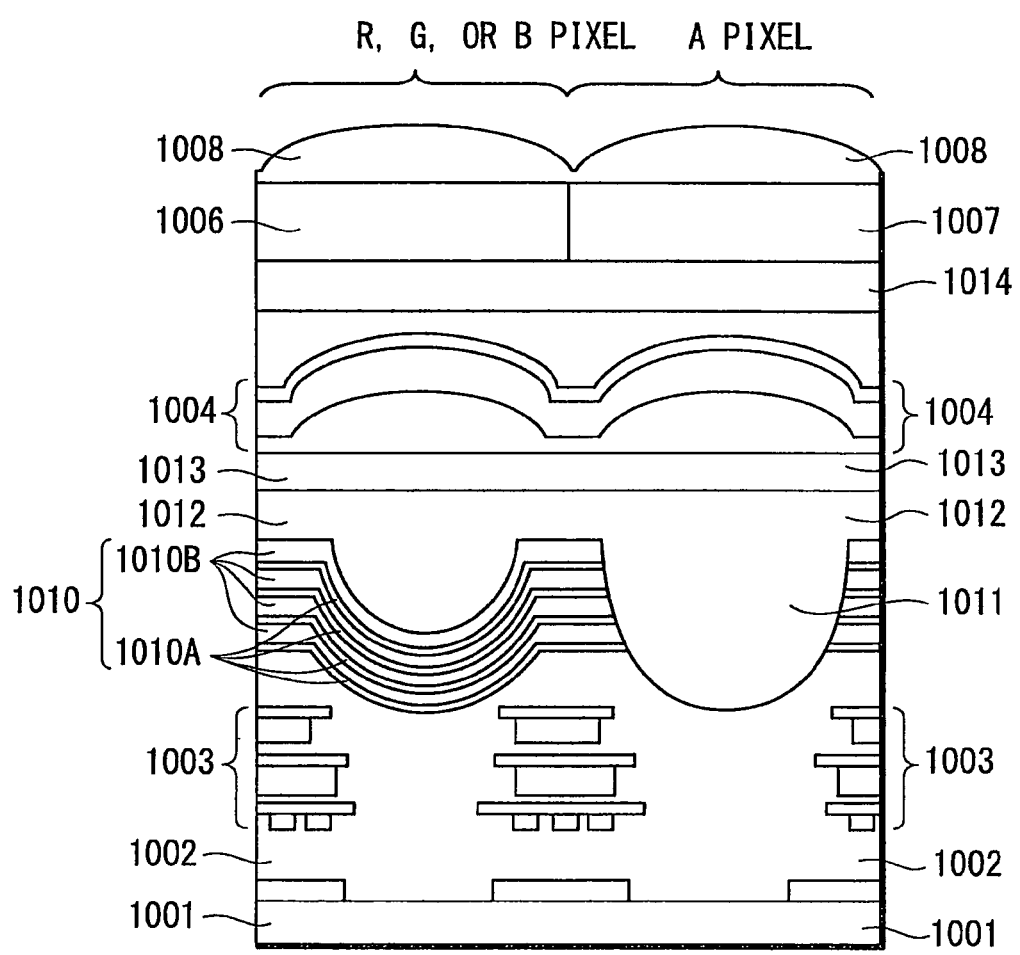
FIG. 22 is a schematic cross-sectional view illustrating a solid-state imaging device according to a ninth embodiment of the present invention.

Next, FIG. 22 is a schematic cross-sectional view of a solid-state imaging device according to a ninth embodiment of the present invention.

In the device of the present embodiment, the shapes of an on-chip filter 1010 (1010A and 1010B) and an optical waveguide 1011 are different from those of the device of the sixth embodiment as shown in FIG. 19. In other words, the curved surface is changed from an upwardly-convex shape to a downwardly-convex shape.

Furthermore, in the device of the sixth embodiment as shown in FIG. 19, the lateral wall surface of the optical waveguide 1011 is linearly sloped. In contrast, in the present embodiment, the optical waveguide 1011 has a sloped lateral wall whose surface is curved. Such a kind of the lateral wall surface can be formed by, for example, a wet-etching technology.

Here, other structural components are similar to those of the sixth embodiment in FIG. 19 as described above. Therefore, the same structural components in FIG. 22 are designated by the same reference numerals of the corresponding components in FIG. 19 and their duplicate descriptions will be omitted.

The device of the ninth embodiment may require a concave upper surface of an insulating layer 1002 to make the on-chip filter 1010 whose surface is curved. Thus, a step for making the curved upper surface of the insulating layer 1002 is carried out in the production.

The configuration of the solid-state imaging device of the present embodiment will exert the following effects as in the case of the aforementioned embodiments.

In other words, occurrence of color-mixing can be suppressed. Besides, it is possible to keep the level of color-mixing at least at the same level as that of the related-art device having no on-chip filter even though the height of the device is increased by the formation of the on-chip filter 1010.

In addition, the device reproduces true colors correctly in the process of color reproduction. Thus, it becomes possible to obtain an image with improved quality. Furthermore, there is no substantial influence of variations in thickness on the wavelength spectrum at the time of the production. Therefore, the device of the present embodiment can be manufactured in a stable manner with an improvement in production yield.

Furthermore, the shading property of the device can be improved.

Moreover, light incident between the stacked films 1010A and 1010B of the on-chip filter 1010 can be prevented from being directed toward the light-receiving section of the pixel.

In any of the aforementioned embodiments, the present invention is applied to a CMOS solid-state imaging device (CMOS image sensor). Alternatively, the present invention may be applied to a solid-state imaging device having another configuration such as a CCD solid-state imaging device (CCD image sensor).

In any of the aforementioned embodiments, the light-receiving section formed of the photodiode (PD) is formed in the silicon substrate 1001. However, the substrate with the light-receiving section is not limited to the silicon substrate. Alternatively, for example, according to an embodiment of the present invention, a semiconductor substrate made of any of semiconductors except silicon, a semiconductor substrate on which a semiconductor epitaxial layer is formed, or the like can be used.

Any of the aforementioned embodiments is a surface-illuminated structure where light is incident on the light-receiving section of the silicon substrate 1001 from the same side where the wiring layer 1003 is provided.

Alternatively, according to an embodiment of the present invention, a solid-state imaging device having a back-illuminated structure is used where a wiring layer may be formed on the side of a substrate opposite to the side where an on-chip lens and an on-chip filter are provided to allow the light to be incident from the side opposite to the wiring layer.

In any of the aforementioned embodiments, the lateral wall of the optical waveguide 1011 is sloped to form a tapered structure gradually narrowing to the bottom.

The present invention is not limited to such a configuration. Alternatively, the lateral wall surface of the optical waveguide may be almost perpendicular to the principal surface of the substrate. In this case, light incident on the lateral wall surface of the optical waveguide can be reflected.

The inclination of the lateral wall surface of the optical waveguide may be determined depending on the conditions of the step for forming a hole to be provided as an optical waveguide, such as an etching step, the depth of the hole, and so on. The lateral wall surface of the optical waveguide may be inclined not large under the typically-employed etching conditions.

Furthermore, the position where the on-chip filter is formed is not limited to the position described in any of the aforementioned embodiments. Alternatively, the on-chip filter may be formed above a position still higher than the on-chip lens.

According to further embodiment of the present invention, a camera can be provided including the solid-state imaging device of any of the aforementioned embodiments. The configuration of the camera according to an embodiment of the present invention may be applied on any of cameras, such as a mobile phone unit with a camera device or a camera function.

Figure 23:
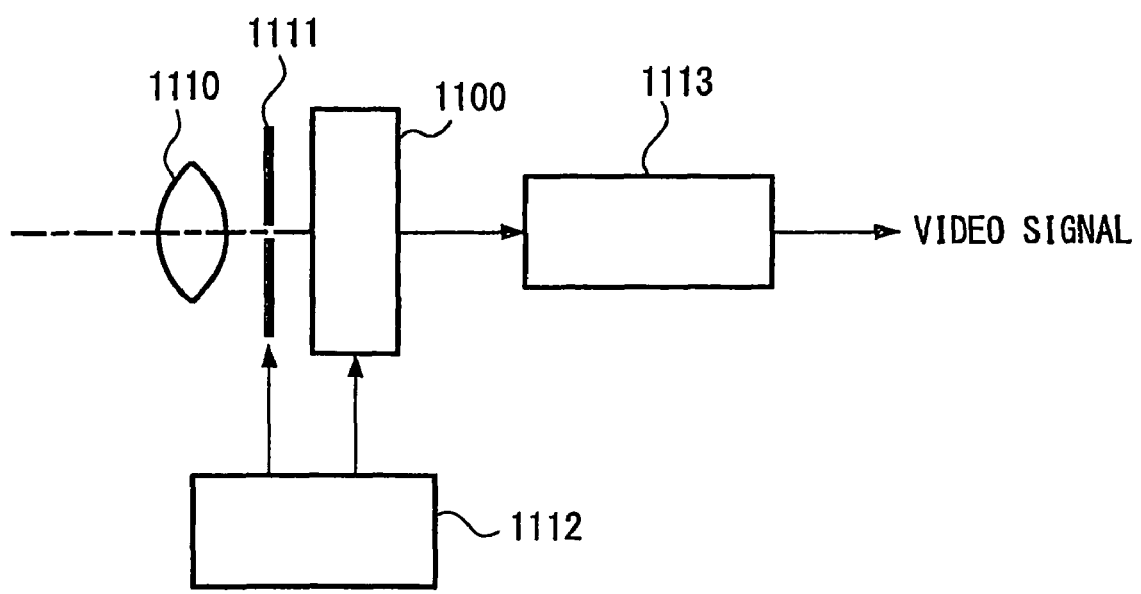
FIG. 23 is a schematic view illustrating a camera according to an embodiment of the present invention.

Referring now to FIG. 23, the configuration of a camera according to an embodiment of the present invention will be described. As shown in FIG. 23, the camera includes a semiconductor imaging device 1100, an optical system 1110, a shutter device 1111, a driving circuit 1112, and a signal-processing circuit 1113.

The camera according to the present embodiment is a video camera capable of capturing moving images.

The optical system 1110 allows image light (incident light) from a subject to form an image on the imaging surface of the semiconductor imaging device 1100. Thus, signal charges can be accumulated with irradiation of image light in the semiconductor imaging device 1100 and retained for a certain period.

The shutter device 1111 is responsible for controlling a light-irradiation period to the semiconductor imaging sensor 1100 and a light-shielding period.

The driving circuit 1112 supplies driving signals to control the transfer operation of the semiconductor imaging device 1100 and the shutter operation of the shutter device 1111. Driving signals (timing signals) supplied from the driving circuit 1112 allow the semiconductor imaging device 1100 to carry out voltage detection or charge transfer. The signal processing circuit 1113 carries out various kinds of signal processing. Video signals subjected to the signal processing are stored in a storage medium, such as memory, or displayed on a monitor.

Subsequently, in the camera shown in FIG. 23, the solid-state imaging device according to any of the above-described embodiments of the present invention is used as the semiconductor imaging device 1100.

The present invention is not limited to any of the aforementioned embodiments. Various modifications can be applied without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   an optical inner filter layer configured to block infrared wavelengths of light;
   an inner-layer lens between said optical inner filter layer and a photodiode, said inner-layer lens including a convex surface of a first interlayer film and a concave surface of a second interlayer film,
   wherein said convex surface is between said photodiode and said concave surface, said optical inner filter layer being between said concave surface and a color filter.

2. The solid-state imaging device according to claim 1, wherein said concave surface is in physical contact with said convex surface.

3. The solid-state imaging device according to claim 1, wherein an area of said optical inner filter layer is larger than an area for said photodiode.

4. The solid-state imaging device according to claim 1, wherein an insulating interlayer is between said photodiode and said first interlayer film, wiring layers being within said insulating interlayer.

5. The solid-state imaging device according to claim 1, wherein a surface of said optical inner filter layer has a convex shape or a concave shape.

6. The solid-state imaging device according to claim 1, wherein said optical inner filter layer is between said second interlayer film and a planarizing layer, said color filter being between said planarizing layer and a microlens.

7. The solid-state imaging device according to claim 1, wherein said optical inner filter layer is configured to transmit visible wavelengths of the light.

8. The solid-state imaging device according to claim 1, wherein a refractive index of said second interlayer film differs from a refractive index of said first interlayer film.

9. The solid-state imaging device according to claim 1, wherein a refractive index of said second interlayer film is lower than a refractive index of said first interlayer film.

10. The solid-state imaging device according to claim 1 wherein said infrared wavelengths of the light and visible wavelengths of the light are transmissible through said color filter.

11. The solid-state imaging device according to claim 1 wherein said photodiode is configured to convert said light into a signal electric charge, said signal electric charge being proportional to a quantity of said light incident upon said photodiode.

12. The solid-state imaging device according to claim 1, wherein said optical inner filter layer is a plurality of dielectric films, a second one of the dielectric films being between first and third ones of the dielectric films.

13. The solid-state imaging device according to claim 12, wherein said second one of the dielectric films is in physical contact with said first and third ones of the dielectric films.

14. The solid-state imaging device according to claim 12, wherein a refractive index for said first and third ones of the dielectric films is the same, said refractive index for said first and third ones of the dielectric films differing from a refractive index for said second one of the dielectric films.

15. The solid-state imaging device according to claim 1, further comprising:
   a buried layer configured to transmit said infrared wavelengths of the light, said second interlayer film being between said first interlayer film and said buried layer.

16. The solid-state imaging device according to claim 15, wherein said optical inner filter layer is between said buried layer and another buried layer, said another buried layer between another concave surface of the second interlayer film and another color filter.

17. The solid-state imaging device according to claim 15, wherein a different convex surface of the first interlayer film is between a different photodiode and a different concave surface of the second interlayer film, said buried layer being between said different concave surface and a different color filter.

18. The solid-state imaging device according to claim 17, wherein said different concave surface is in physical contact with said different convex surface.

19. A camera comprising:
   the solid-state imaging device according to claim 1; and
   an optical lens system.

* * * * *